(12) United States Patent
Lukin et al.

(10) Patent No.: US 10,712,406 B2
(45) Date of Patent: Jul. 14, 2020

(54) QUANTUM METROLOGY BASED ON STRONGLY CORRELATED MATTER

(71) Applicants: President and Fellows of Harvard College, Cambridge, MA (US); The Regents of The University of California, Oakland, CA (US)

(72) Inventors: Mikhail D. Lukin, Cambridge, MA (US); Soonwon Choi, Cambridge, MA (US); Norman Yao, Berkeley, CA (US)

(73) Assignees: President and Fellows of Harvard College, Cambridge, MA (US); The Regents of The University of California, Oakland, CA (US)

( * ) Notice: Subject to any disclaimer, the term of this patent is extended or adjusted under 35 U.S.C. 154(b) by 0 days.

(21) Appl. No.: 16/235,060

(22) Filed: Dec. 28, 2018

(65) Prior Publication Data

US 2019/0219644 A1     Jul. 18, 2019

Related U.S. Application Data

(60) Provisional application No. 62/616,774, filed on Jan. 12, 2018.

(51) Int. Cl.
   *G01V 3/00*     (2006.01)
   *G01R 33/12*    (2006.01)
   (Continued)

(52) U.S. Cl.
   CPC ......... *G01R 33/1284* (2013.01); *G01N 24/08* (2013.01); *G01R 33/26* (2013.01); *G01R 33/445* (2013.01)

(58) Field of Classification Search
   USPC ........................................... 324/304
   See application file for complete search history.

(56) References Cited

U.S. PATENT DOCUMENTS

2012/0319684 A1*  12/2012  Gambetta ............... H01L 39/04
                                                       324/304
2015/0316598 A1*  11/2015  Rogge ..................... B82Y 10/00
                                                       324/304

(Continued)

OTHER PUBLICATIONS

Aasi et al., "Enhanced sensitivity of the LIGO gravitational wave detector by using squeezed states of light." Nature Photonics, vol. 7, No. 8, Oct. 1, 2013, 10 pages.

(Continued)

*Primary Examiner* — Rodney E Fuller
(74) *Attorney, Agent, or Firm* — Wilmer Cutler Pickering Hale and Dorr LLP

(57) ABSTRACT

A method for quantum metrology using stable non-equilibrium states of quantum matter, such as many-body quantum spin systems, is disclosed. The approach can utilize quantum correlations in such many-body quantum spin systems stabilized by strong interactions and periodic driving for reduction of noise. As an example, an exemplary protocol to perform Floquet enhanced measurements of an oscillating magnetic field in Ising-interacting spin systems is provided. These approaches allow for circumvention of the interaction-induced decoherence associated with high density spin ensembles and is robust to the presence of noise and imperfections. The protocol is applicable to nanoscale magnetic sensing and other precision measurements.

23 Claims, 11 Drawing Sheets

(51) Int. Cl.
   *G01R 33/26* (2006.01)
   *G01N 24/08* (2006.01)
   *G01R 33/44* (2006.01)

(56) References Cited

U.S. PATENT DOCUMENTS

| | | | | |
|---|---|---|---|---|
| 2016/0061914 A1* | 3/2016 | Jelezko | .................. | B82Y 10/00 324/304 |
| 2018/0149717 A1* | 5/2018 | Jelezko | .................. | G01R 33/26 |
| 2019/0049495 A1* | 2/2019 | Ofek | .................. | G01R 33/1284 |
| 2019/0235031 A1* | 8/2019 | Ibrahim | ............... | G01R 33/032 |

OTHER PUBLICATIONS

Abanin et al. "A Theory of many-body localization in periodically driven systems." Annals of Physics, vol. 372, Aug. 11, 2015, 8 pages.
Abanin et al., "A rigorous theory of many-body prethermalization for periodically driven and closed quantum systems." Communications in Mathematical Physics, Jul. 11, 2017, vol. 354, No. 3. arXiv Jul. 9, 2017, 21 pages.
Abanin et al., "Exponentially slow heating in periodically driven many-body systems." Physical Review Letters, vol. 115, No. 25, Jul. 29, 2015, 5 pages.
Allred et al., "High-sensitivity atomic magnetometer unaffected by spin-exchange relaxation." Physical Review Letters, Sep. 23, 2002, vol. 89, No. 13, 4 pages.
Bar-Gill et al., "Solid-state electronic spin coherence time approaching one second," Nature Communications, Apr. 23, 2013, vol. 4, No. 1, pp. 1-6.
Barry et al., "Optical magnetic detection of single-neuron action potentials using quantum defects in diamond." Proceedings of the National Academy of Sciences, Dec. 6, 2016, vol. 113, No. 49, pp. 14133-14138 and E6730. 7 pages.
Basko et al., "Metal-insulator transition in a weakly interacting many-electron system with localized single-particle states." Annals of Physics, Feb. 2, 2008, vol. 321, No. 5, 99 pages.
Betzig, "Nobel Lecture: Single molecules, cells, and super-resolution optics," Reviews of Modern Physics, Oct. 21, 2015, vol. 87, No. 4, pp. 1153-1168.
Bloom et al., "An optical lattice clock with accuracy and stability at the $10^{-18}$ level." Nature, Feb. 6, 2014, vol. 506, No. 7486, 7 pages.
Bohnet et al., "Quantum spin dynamics and entanglement generation with hundreds of trapped ions." Science, vol. 352, No. 6291, Jan. 7, 2016, 40 pages.
Budker et al., "Proposal for a cosmic axion spin precession experiment (CASPEr)," Physical Review X, published May 19, 2014, vol. 4, No. 2, pp. 021030-1 to 021030-10.
Bugrij, "The correlation function in two dimensional Ising model on the finite size lattice. I." Theoretical and Mathematical Physics, Apr. 2001, vol. 127, No. 1, 25 pages.
Choi et al., "Depolarization Dynamics in a Strongly Interacting Solid-State Spin Ensemble," Physical Review Letters, Mar. 3, 2017, vol. 118, No. 9, 6 pages.
Choi et al., "Dynamical engineering of interactions in qudit ensembles." Physical Review Letters, Nov. 3, 2017, vol. 119, No. 18, 6 pages.
Choi et al., "Observation of discrete time-crystalline order in a disordered dipolar many-body system." Nature, vol. 543, No. 7644, author manuscript Sep. 8, 2017, 23 pages.
De Lange et al., "Universal dynamical decoupling of a single solid-state spin from a spin bath." Science, Oct. 1, 2010, vol. 330, No. 6000, 16 pages.
Degen et al., "Quantum sensing," Reviews of Modern Physics, Jul. 25, 2017, vol. 89, No. 3, pp. 035002-1 to 035002-39.
Deutsch et al., "Spin self-rephasing and very long coherence times in a trapped atomic ensemble." Physical Review Letters, Jul. 9, 2010, vol. 105, No. 2, 4 pages.
Diddams et al., "An optical clock based on a single trapped 199Hg+ ion," Science, Aug. 3, 2001, vol. 293, No. 5531, pp. 825-828.

Dutta et al., "Phase transitions in the quantum Ising and rotor models with a long-range interaction." Physical Review B, Oct. 18, 2001, vol. 64, No. 18, 7 pages.
Elliott et al., "The Ising model with a transverse field. I. High temperature expansion." Journal of Physics C: Solid State Physics, Oct. 1971, vol. 4, No. 15, 12 total pages.
Else et al., "Floquet time crystals." Physical Review Letters, Aug. 26, 2016, vol. 117, No. 9, 5 pages.
Else et al., "Prethermal phases of matter protected by time-translation symmetry." Physical Review X, Mar. 7, 2017, vol. 7, No. 1, 21 pages.
Essler et al., "Finite-temperature dynamical correlations in massive integrable quantum field theories." Journal of Statistical Mechanics: Theory and Experiment, vol. 2009, No. 09, Oct. 7, 2009, 54 pages.
Fey et al., "Critical behavior of quantum magnets with long-range interactions in the thermodynamic limit." Physical Review B, vol. 94, No. 7, Sep. 5, 2016, 12 pages.
Fisher et al., "Critical exponents for long-range interactions." Physical Review Letters, Oct. 2, 1972, vol. 29, No. 14, pp. 917-920.
Fonseca et al. "Ising field theory in a magnetic field: analytic properties of the free energy." Journal of Statistical Physics, vol. 110, No. 3-6, Dec. 19, 2001, 66 pages.
Frerot et al., "Quantum Critical Metrology," Physical Review Letters, received Aug. 1, 2017, published Jul. 11, 2018, vol. 121, 6 pages.
Friedman, "Ising model with a transverse field in two dimensions: Phase diagram and critical properties from a real-space renormalization group." Physical Review B, Feb. 1, 1978, vol. 17, No. 3, pp. 1429-1432.
Glenn et al., "Micrometer-scale magnetic imaging of geological samples using a quantum diamond microscope." Geochemistry, Geophysics, Geosystems, published online Aug. 22, 2017, vol. 18, No. 8, pp. 3254-3267.
Hahn, "Spin echoes." Physical Review, Nov. 15, 1950, vol. 80, No. 4, 22 pages.
Hauke et al., "Measuring multipartite entanglement through dynamic susceptibilities." Nature Physics, vol. 12, No. 8, Sep. 5, 2015, 11 pages.
Ho et al., "Critical time crystals in dipolar systems." Physical Review Letters, vol. 119, No. 1, Jul. 7, 2017, 9 pages.
Hosten et al., "Measurement noise 100 times lower than the quantum-projection limit using entangled atoms." Nature, Jan. 28, 2016, vol. 529, No. 7587, 7 pages.
Jiang et al., "Universal dynamical decoupling of multiqubit states from environment." Physical Review A, Dec. 28, 2011, vol. 84, No. 6, 4 pages.
Khemani et al., "Phase structure of driven quantum systems." Physical Review Letters, Jun. 24, 2016, vol. 116, No. 25, pp. 250401-1 to 250401-6.
Knap et al., "Probing Real-Space and Time-Resolved Correlation Functions with Many-Body Ramsey Interferometry." Physical Review Letters, Oct. 4, 2013, vol. 111, No. 14, 6 pages.
Kolkowitz et al., "Gravitational wave detection with optical lattice atomic clocks." Physical Review D, Dec. 27, 2016, vol. 94, No. 12, 15 pages.
Kucsko et al., "Critical Thermalization of a Disordered Dipolar Spin System in Diamond," Physical Review Letters, submitted Sep. 26, 2016, arXiv Oct. 25, 2017, 47 pages.
Kuo et al., "Quadratic dynamical decoupling: Universality proof and error analysis." Physical Review A, vol. 84, No. 4, Jun. 10, 2011, 18 pages.
Kuwahara et al., "Floquet-Magnus theory and generic transient dynamics in periodically driven many-body quantum systems." Annals of Physics, vol. 367, Feb. 12, 2016, 19 pages.
Lazarides et al., "Fate of many-body localization under periodic driving." Physical Review Letters, Jul. 27, 2015, vol. 115, No. 3, 9 pages.
Lovchinsky et al., "Magnetic resonance spectroscopy of an atomically thin material using a single-spin qubit." Science, Jan. 19, 2017, vol. 355, No. 6324, 18 pages.
Lovchinsky et al., "Nuclear magnetic resonance detection and spectroscopy of single proteins using quantum logic." Science, Feb. 19, 2016, vol. 351, No. 6275, 7 pages.

(56) References Cited

OTHER PUBLICATIONS

Macieszczak et al., "Dynamical phase transitions as a resource for quantum enhanced metrology." Physical Review A, Feb. 3, 2016, vol. 93, No. 2, 10 pages.

Maghrebi et al., "Causality and quantum criticality in long-range lattice models." Physical Review B, Mar. 17, 2016, vol. 93, No. 12, 18 pages.

Maurer et al., "Room-temperature quantum bit memory exceeding one second." Science, Jun. 8, 2012, vol. 336, No. 6086, 5 pages.

Maze et al., "Nanoscale magnetic sensing with an individual electronic spin in diamond," Nature, Oct. 2, 2008, vol. 455, No. 7213, 9 pages.

Mori et al., "Rigorous bound on energy absorption and generic relaxation in periodically driven quantum systems." Physical Review Letters, vol. 116, No. 12, Mar. 17, 2017, 11 pages.

Nandkishore et al., "Many-body localization and thermalization in quantum statistical mechanics." Annual Review of Condensed Matter Physics, Mar. 2015, vol. 6, No. 1, 38 pages.

Pfeuty et al. "The Ising model with a transverse field. II. Ground state properties." Journal of Physics C: Solid State Physics, Oct. 1971, vol. 4, No. 15, 17 pages.

Pham et al., "Magnetic field imaging with nitrogen-vacancy ensembles," New Journal of Physics, vol. 13, No. 4, published Apr. 28, 2011, 14 pages.

Ponte et al., "Many-body localization in periodically driven systems." Physical Review Letters, vol. 114, No. 14, Oct. 30, 2014, 7 pages.

Schreiber et al., "Observation of many-body localization of interacting fermions in a quasi-random optical lattice," Science, Jan. 22, 2015, vol. 349, No. 6250, 14 pages.

Skotiniotis et al., "Quantum metrology for the Ising Hamiltonian with transverse magnetic field." New Journal of Physics, Jul. 31, 2015, vol. 17, No. 7, 12 pages.

Smith et al., "Many-body localization in a quantum simulator with programmable random disorder." Nature Physics, Oct. 2016, vol. 12, No. 10, pp. 907-911.

Strobel et al., "Fisher information and entanglement of non-Gaussian spin states." Science, Jul. 25, 2014, vol. 345, No. 6195, 11 pages (arXiv version Jul. 14, 2015).

Taylor et al., "High-sensitivity diamond magnetometer with nanoscale resolution," Nature Physics, Sep. 14, 2008, vol. 4, 7 pages.

Von Keyserlingk et al. "Absolute stability and spatiotemporal long-range order in Floquet systems." Physical Review B, Aug. 8, 2016, vol. 94, No. 8, 11 pages.

Waugh et al., "Approach to high-resolution NMR in solids." Physical Review Letters, Jan. 29, 1968, vol. 20, No. 5, 4 pages.

Yao et al., "Discrete Time Crystals: Rigidity, Criticality, and Realizations," Phys. Rev. Lett., Jan. 20, 2017, vol. 118, 6 pages.

Zanardi et al., "Quantum criticality as a resource for quantum estimation." Physical Review A, Oct. 9, 2008, vol. 78, No. 4, 7 pages.

Zhang et al., "Observation of a discrete time crystal." Nature, Mar. 9, 2017, vol. 543, No. 7644, 12 pages.

Zurek et al., "Dynamics of a quantum phase transition." Physical Review Letters (2005) vol. 95, No. 10. arXiv Feb. 14, 2006, 4 pages.

\* cited by examiner

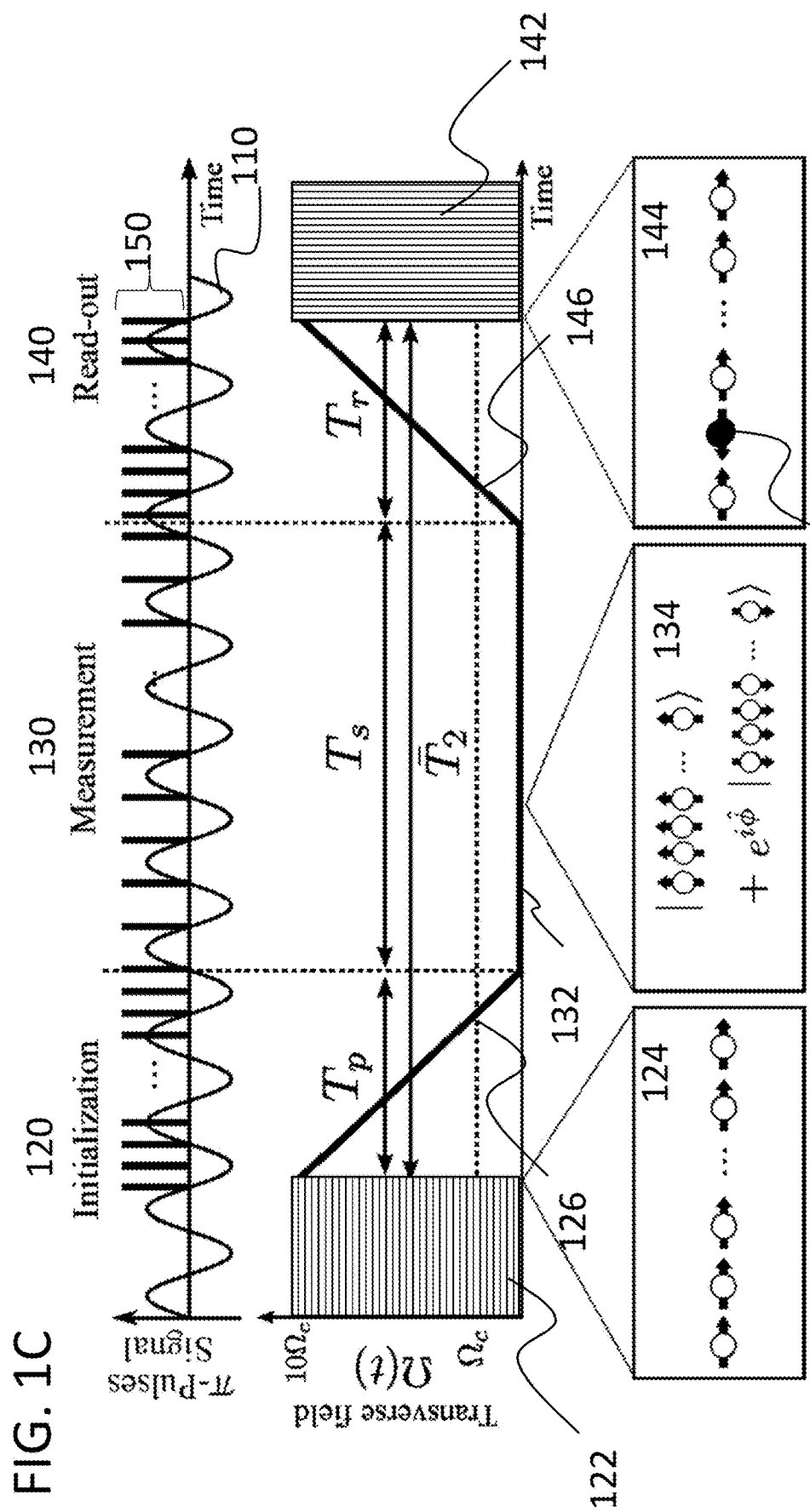

QUANTUM METROLOGY BASED ON STRONGLY CORRELATED MATTER

CROSS-REFERENCE TO RELATED APPLICATIONS

This application claims the benefit of priority to U.S. Provisional Application No. 62/616,774, entitled "QUANTUM METROLOGY BASED ON STRONGLY CORRELATED MATTER," filed on Jan. 12, 2018, the disclosure of which is hereby incorporated by reference in its entirety.

STATEMENT OF GOVERNMENTAL INTEREST

This invention was made with Government support under Grant No. PHY-1654740 awarded by the National Science Foundation ("NSF"), Grant No. N00014-15-1-2846 awarded by the Department of Defense ("DOD"), and Grant No. PHY-1125846 awarded by the NSF. The Government has certain rights in the invention.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

TECHNICAL FIELD

This patent relates to quantum metrology and more particularly to quantum metrology based on strongly correlated states.

BACKGROUND

The ability to interrogate a physical system and precisely measure its observables forms the basis of both fundamental and applied sciences. While certain techniques are based on specially controlled individual particles, in general, large ensembles can be used to enhance measurement sensitivity. However, existing techniques are limited by inter-particle interactions.

SUMMARY

According to some embodiments, a method includes: initializing an ensemble of quantum spins in an entangled state; driving the ensemble of quantum spins in the entangled state with periodic electromagnetic pulses at a driving frequency while the ensemble of quantum spins is exposed to an external signal, wherein the driving frequency is tuned based on the frequency of the external signal to be measured; reading out a state of the ensemble of quantum spins, wherein the state of the ensemble of quantum spins is indicative of the strength of the external signal.

According to some embodiments, the driving frequency is approximately twice the signal frequency.

According to some embodiments, the electromagnetic pulses comprise π-pulses.

According to some embodiments, the ensemble of quantum spins comprises a plurality of NV spin centers in diamond.

According to some embodiments, the method further includes polarizing, prior to the initializing, the ensemble of quantum spins by applying an external magnetic field at a first field strength to the ensemble of quantum spins.

According to some embodiments, the external magnetic field has a strength that is stronger than the strength of ferromagnetic interactions between the NV spin centers.

According to some embodiments, the initializing the ensemble of quantum spins in the strongly entangled state comprises reducing the strength of the external magnetic field to a second field strength.

According to some embodiments, the method further includes applying, during the initializing, periodic π-pulses to the ensemble of quantum spins at a frequency that is detuned from the signal frequency.

According to some embodiments, the second field strength is zero.

According to some embodiments, the second field strength is greater than a field strength that would cause a phase transition of the ensemble of quantum spins.

According to some embodiments, the method further includes increasing the external magnetic field strength to a third field strength prior to the reading out the state of the ensemble of quantum spins.

According to some embodiments, the third magnetic field strength is the same as the first magnetic field strength.

According to some embodiments, the increasing the external magnetic field strength to the third field strength is performed at the same rate as the decreasing the magnetic field strength to the second magnetic field strength.

According to some embodiments, the plurality of NV spin centers have a density in the diamond of approximately 10-4 to approximately 0.01 spins/nm2.

According to some embodiments, the strongly entangled state is one or more of a Greenberger-Horne-Zeilinger ("GHZ") state, a NOON state, a W-state, any other gaussian or non-gaussian squeezed state, or another similarly entangled state.

According to some embodiments, the reading out the state of the ensemble of quantum spins comprises determining the average parity of the ensemble of quantum spins.

According to some embodiments, the reading out the state of the ensemble of quantum spins comprises determining the magnetization of the ensemble of quantum spins.

According to some embodiments, the reading out the state of the ensemble of quantum spins is performed with one or more of an avalanche photodetector (APD) or a single photon counting module (SPCM).

According to some embodiments, the method further includes repeating the initializing, driving, and reading out for at least one second signal frequency to determine an external signal spectrum.

According to some embodiments, the driving frequency is approximately twice the signal frequency minus an offset value of 2Δω.

According to some embodiments, the ensemble of quantum spins comprises a two-dimensional array of quantum spins.

According to some embodiments, the entangled state of the ensemble of quantum spins acts as a two-state system.

24 According to some embodiments, in the entangled state, one or more of Quantum Fisher information or linear susceptibility is enhanced compared to disentangled states.

These and other capabilities of the disclosed subject matter will be more fully understood after a review of the following figures, detailed description, and claims. It is to be understood that the phraseology and terminology employed herein are for the purpose of description and should not be regarded as limiting.

BRIEF DESCRIPTION OF FIGURES

Various objectives, features, and advantages of the disclosed subject matter can be more fully appreciated with reference to the following detailed description of the disclosed subject matter when considered in connection with the following drawings, in which like reference numerals identify like elements.

FIGS. 1A-1G show a sensing protocol, according to some embodiments.

DETAILED DESCRIPTION

Figure 1A:
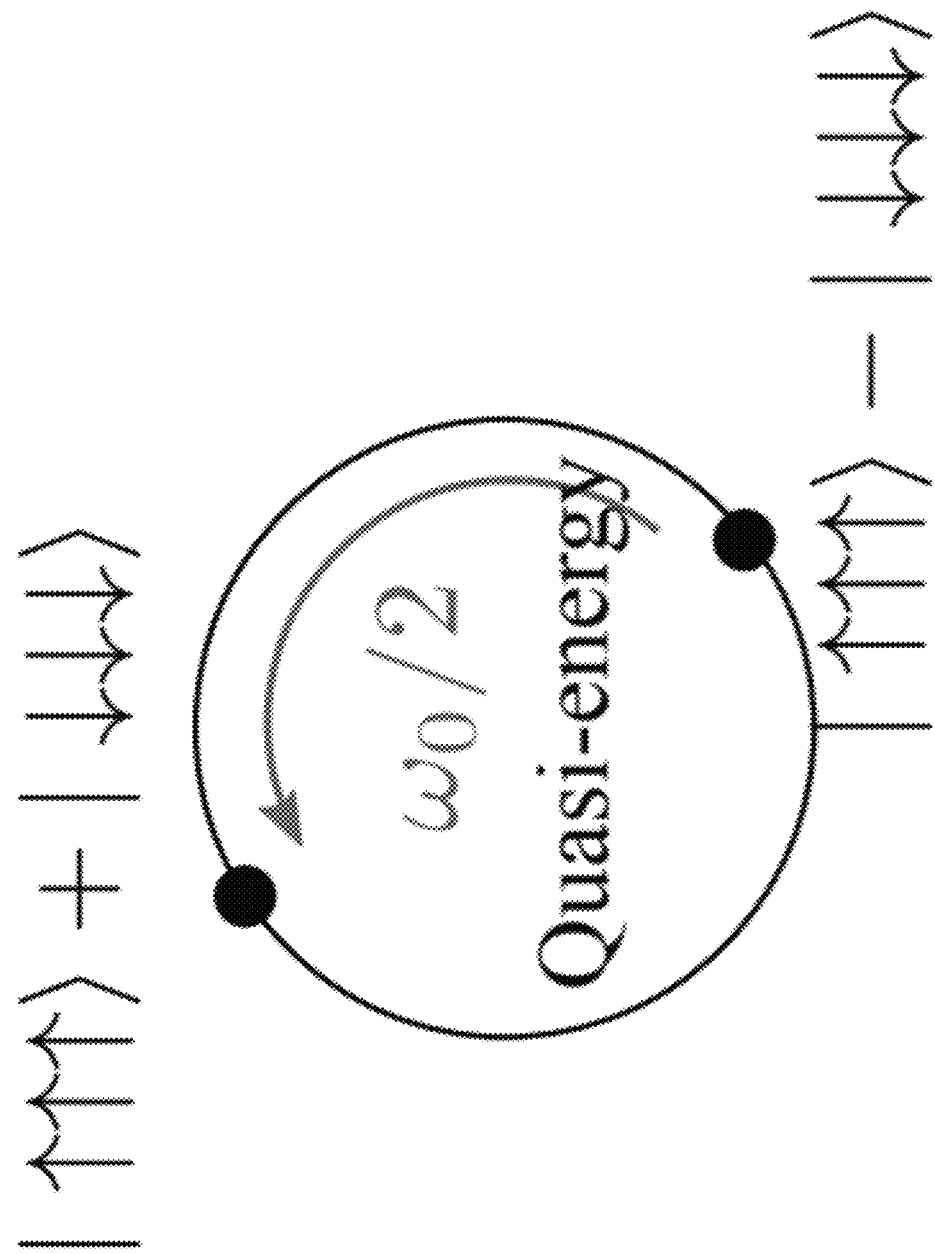

According to some embodiments, the disclosed techniques facilitate the use of many-body strongly entangled quantum spins for measuring oscillating signals with reduced decoherence caused by noise. For example, the quantum spins can be prepared in a strongly entangled state. While such entangled states of n particles are approximately n times more sensitive than single spin systems, they are also approximately n-times more susceptible to noise. Accordingly, in some embodiments, to reduce the effects of common (or typical) noise while still maintaining some sensitivity gains owing to quantum entanglement, the quantum spins can be driven periodically at a driving frequency, $\omega_0$, (e.g., Floquet frequency) that is tuned to the frequency of the signal to be measured, $\omega_s$. In some embodiments the driving frequency $\omega_0$ is approximately twice the signal frequency $\omega_s$. According to other embodiments, the driving frequency $\omega_0$ is approximately slightly detuned from this number by a value of $\Delta\omega$. Accordingly, decoherence caused by noise can be reduced, facilitating increased sensitivity to oscillating signals. Furthermore, since the disclosed technique increases sensitivity to a particular frequency oscillation at $\omega_s$, the driving frequency can be swept during multiple measurements. The disclosed technique utilizes quantum entanglement in order to perform each measurement faster, thereby increasing the bandwidth of the measurement. This technique allows for simple readout by determining, for example, the parity or magnetization of the resulting quantum spins is also disclosed.

For an ensemble of N uncorrelated two-level systems (e.g., quantum spins), the standard quantum limit (SQL) for measuring a small energy shift, scales as $\delta\omega \propto 1/\sqrt{NT_2T}$, where $T_2$ is the relevant coherence time and T is the total measurement duration. While this scaling suggests that increasing the number of particles always improves the signal to noise ratio, the effect of inter-particle interactions needs further consideration. Above a certain density, these inter-particle interactions can limit $T_2$ and thus the maximum achievable sensitivity. Without wishing to be bound by theory, this limit may arise from the fact that interactions typically drive phenomena such as thermalization, which can be used to describe a number of different effects such as decoherence and depolarization, where the system loses both its local coherences and any accumulated spectroscopic signal. Accordingly, while increasing the number of quantum spins can increase the sensitivity of a measurement using those quantum spins as sensors, there may be a limit based on the interactions between quantum spins that produces noise (which can also be referred to as interaction-induced decoherence). In certain instances, this noise can negate the effect of adding more quantum spins to the ensemble, such that sensitivity cannot be further increased simply by adding more quantum spins.

Under certain conditions, a many-body quantum system can evade rapid thermalization, and thus the resulting increased noise. Systems including intrinsically out-of-equilibrium systems (e.g., systems that cannot be described by a conventional thermal state equilibrium) can exhibit robust dynamical features that are forbidden in equilibrium. One such example is the discrete time crystal (DTC), which is protected by an interplay between strong interactions and rapid periodic pulses. The spatio-temporal ordering of the DTC phase is robust to arbitrary static perturbations and has been experimentally observed in both a trapped-ion quantum simulator and a dipolar spin ensemble.

According to some embodiments, the disclosed technique can be used to enhance quantum metrology (e.g., measuring AC magnetic fields, oscillating electric fields, or periodic temperature fluctuations). For example, disclosed herein is a class of protocols that allows for circumventions of the limitations on the effective coherence time that may be imposed by many-body interactions, such as the effective internal noise discussed above. Furthermore, the disclosed protocols can leverage these many-body interactions to develop quantum correlations while reducing the negative effects associated with many-body interactions and imperfections in a system, thereby leading to improved performances in both measurement sensitivity and bandwidth. In some embodiments, sensitivity can be enhanced partially from utilization of a higher density of quantum spins in sensors without a reduction in sensitivity caused by thermalization or other density-dependent noise. Furthermore, in some embodiments both sensitivity and bandwidth can be enhanced by preparing and utilizing quantum correlated states.

According to some embodiments, the technique can be realized by implementing a Floquet system where large quasi-energy gaps protect strongly-entangled states from static perturbations, while still ensuring their sensitivity to an oscillating signal. For example, FIG. 1A shows a representation of a many-body system of quantum spins. As shown in FIG. 1A, a plurality of quantum spins can be strongly coupled such that they can be represented as a superposition of states $|\uparrow\uparrow \ldots \uparrow\rangle + |\downarrow\downarrow \ldots \downarrow\rangle$ and $|\uparrow\uparrow \ldots \uparrow\rangle - |\downarrow\downarrow \ldots \downarrow\rangle$. The quasi-energy gap between the two states is large such that they are protected from static noise. However, the many-body quantum spin system is still susceptible to oscillating signals at a particular frequency, which can cause decoherence, because resonant oscillating signals can exchange energies with the system that compensate for the large quasi-energy gap.

The multi-body quantum spin system described with reference to FIG. 1A can be treated as an effective two-state system, and acted upon using a technique that is similar to spin-echo spectroscopy on single-quantum spin systems. However, unlike in spin-echo spectroscopy, the two levels of the system may in fact be entangled many-body states. Furthermore, according to some embodiments, unlike the typical spin-echo sequence, there is no initial $\pi/2$ pulse, and the disclosed technique involves driving with repeated pulses rather than a single pulse. As discussed above, such many body systems can be affected by interactions between the constituent quantum spins. Accordingly, according to some embodiments, after initializing the many-body quantum spin system in such a state that is typically susceptible to local perturbations in an equilibrium setting, the quantum spins can be periodically driven to stabilize the Schrödinger's-cat-like states.

Figure 1B:
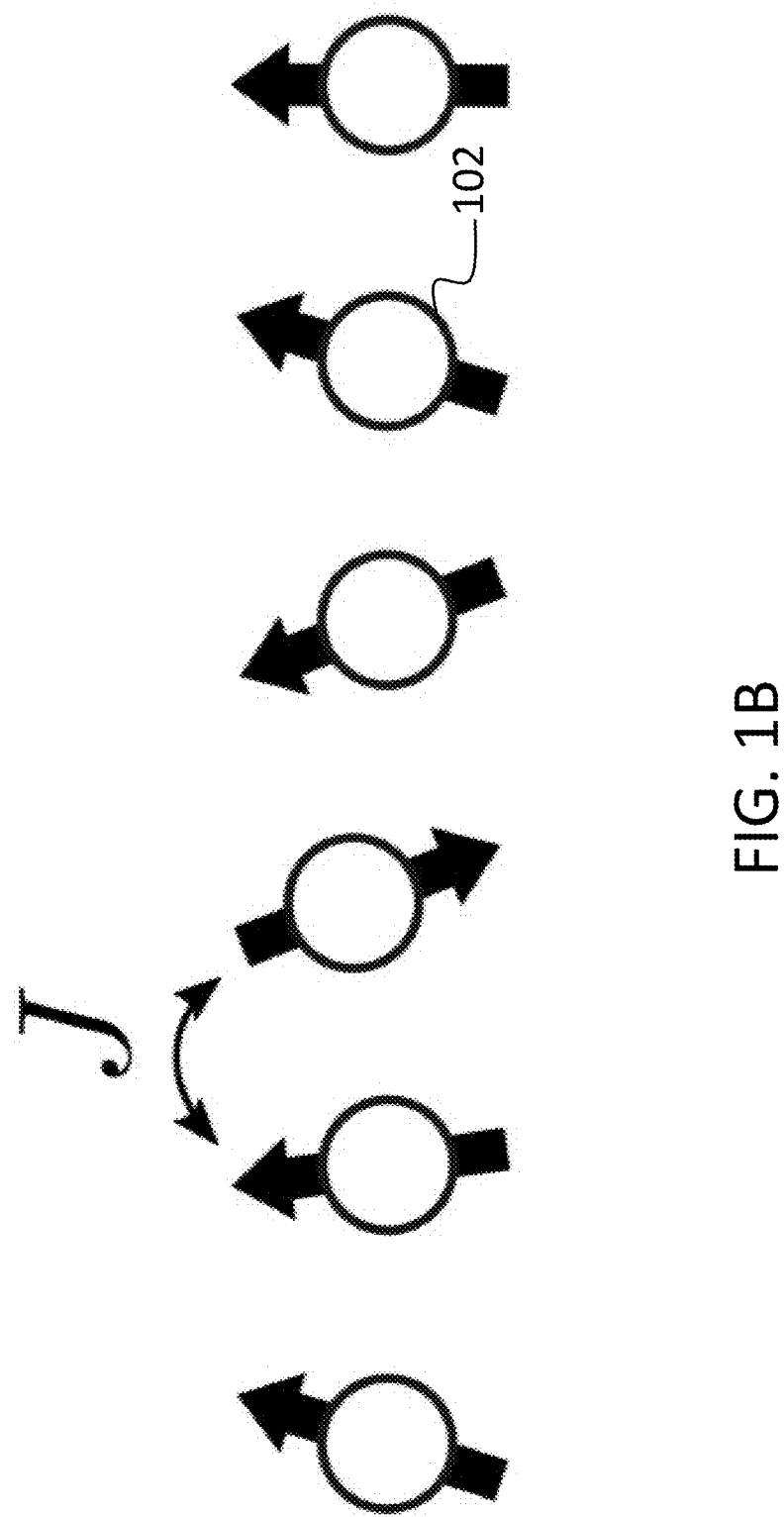
Figure 1G:
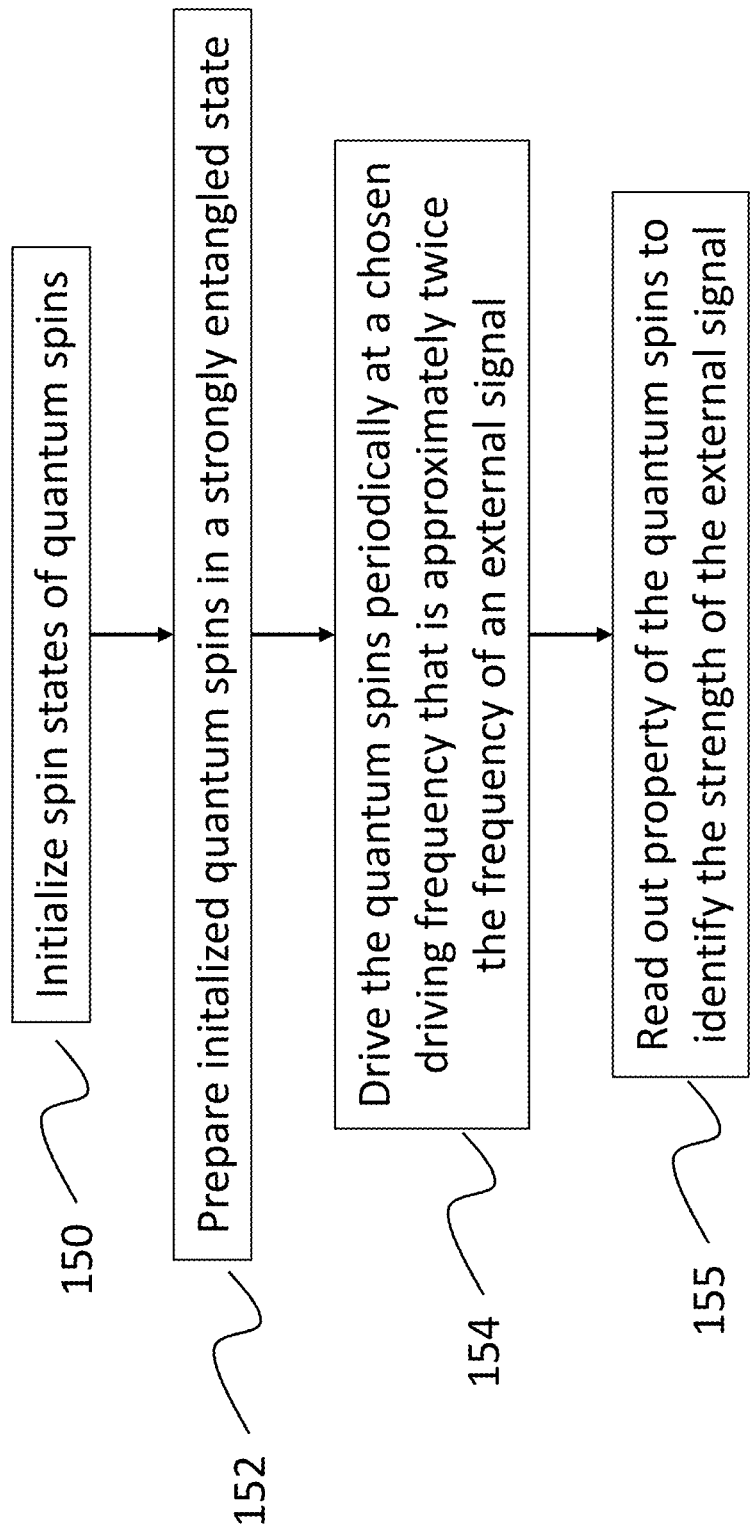

FIG. 1G shows a flowchart showing an exemplary method of operating a many-body quantum spin system according to some embodiments. As shown in FIG. 1G, at step 150, the spin states of the quantum spins in the many-body quantum spin system can be initialized. Depending on the type of quantum spin, the initialization step can include, but is not limited to, applying an external magnetic field, applying an optical pulse or a series of optical pulses, or continuously illuminating a system with optical or microwave irradiations. In step 152 the quantum spins can be prepared in a strongly entangled state. For example, as discussed in more detail with reference to FIG. 1C-1F, the quantum spins can be prepared in a Greenberger-Horne-Zeilinger ("GHZ") quantum state, or a similarly entangled state such as a NOON state or a W-state, or any other gaussian or non-gaussian squeezed states. In these states, Quantum Fisher information and/or linear susceptibility is enhanced compared to disentangled states. In such a state, the many-body quantum spin system can be treated as a two-level system. The steps 150 and 152 can be collectively referred to as an initialization process. In step 154, which can be referred to as the measurement process, the quantum spins can be driven periodically at a chosen driving frequency, $\omega_s$, that is approximately equal to twice the frequency of the external signal to be measured, $\omega_s$. Accordingly, noise and decoherence effects can be reduced for frequencies other than the frequency $\omega_s$, and, according to some embodiments, only the external signals close to the frequency $\omega_s$ are detected by the system. The external signal can include any external oscillating signal to which the quantum spins' states may be sensitive, such as, but not limited to, oscillating magnetic fields, electric fields, and/or temperatures. During the measurement process, some of the spins in the many-body quantum spin system may flip states. It should be appreciated that this process can be referred to as the measurement process because this is the stage in which the external signal acts upon the quantum spin system such that information can then be obtained about the external signal from the quantum spin system. Finally, in step 155, a property of the quantum spins is read out (e.g., average parity or magnetization). The read-out process can include a measurement of the quantum spin system, which is different from the measurement in step 154. Whereas the step 154 uses the quantum spin system to measure the external signal, the step 155 can involve measuring the quantum spin system in order to read-out the property of the external signal. The information from the read-out process can be used to determine a property of the external signal. As discussed in more detail in the examples below.

Figure 3A:
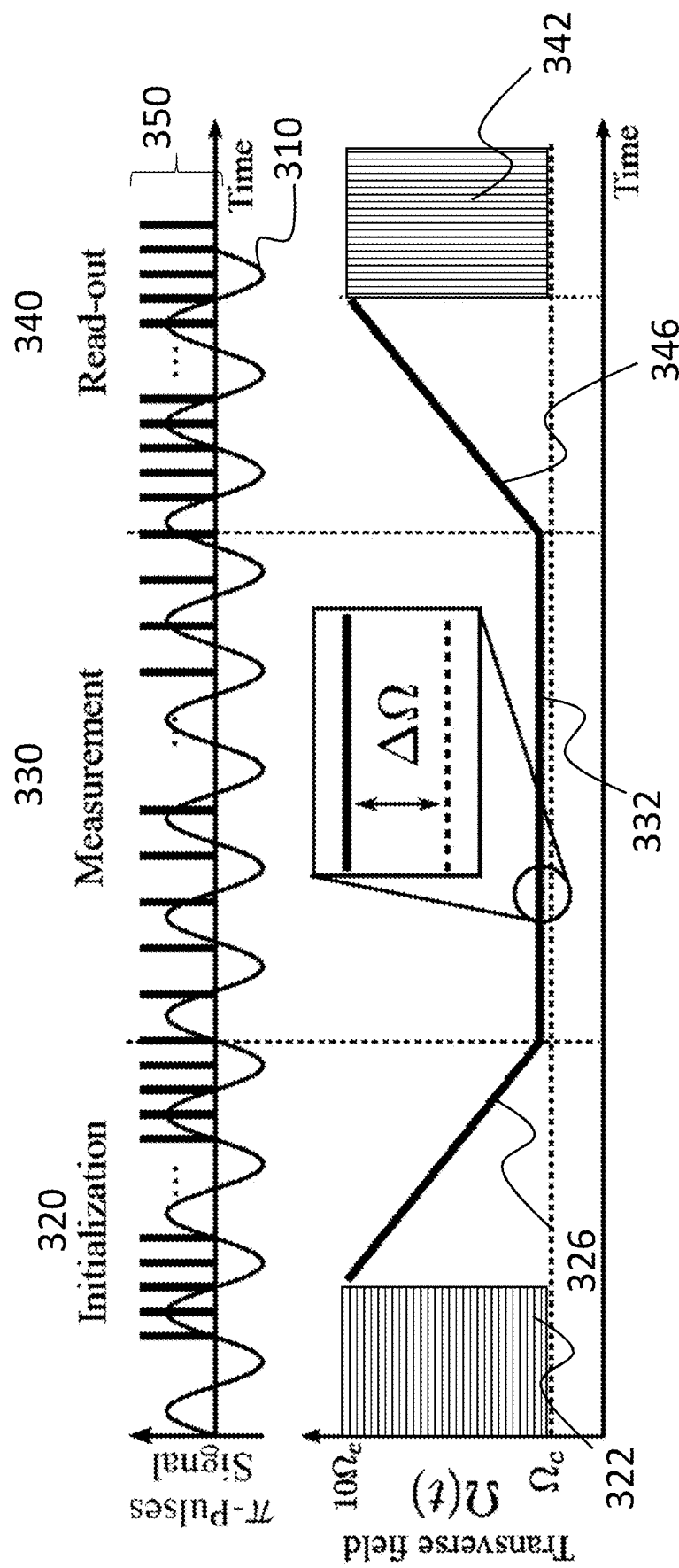
FIGS. 3A-3C show a sensing protocol, according to some embodiments.

According to two exemplary embodiments, two techniques are disclosed that allow for the precise measurement of AC magnetic fields in Floquet spin ensembles: one with reference to FIG. 1A and another with reference to FIG. 3A. As discussed below, these protocols are robust to imperfections in the external control parameters such as the strength and duration of the pulses. This robustness distinguishes our approach from prior studies that utilize either strongly correlated states or advanced dynamical decoupling techniques.

Exemplary Sensing Protocol:

According to these exemplary embodiments, a sensing protocol can be implemented using an ensemble of N spin ½ particles in a d-dimensional array. The N spin ½ particles participate in ferromagnetic Ising interactions. As shown in FIG. 1B, the spin ½ particles 102 can experience ferromagnetic interactions J with their nearest neighbors. The particles 102 can be placed in a tunable transverse field $\Omega$, which can be transverse to the direction of the Ising interactions. The spins can also be coupled to a weak magnetic field signal, B, in the $\hat{z}$-direction oscillating at frequency $\omega_s$. As described below, the sensing protocol can directly measure the strength of the weak magnetic field signal B. The total Hamiltonian for the system can be given by $$\hat{H} = \hat{H}_0 + \hat{H}_{signal} \text{ with } \hat{H}_{signal} = B\sin(\omega_s t)\sum_i \hat{S}_i^z \text{ and} \quad (1)$$

$$\hat{H}_0 = -\sum_{i,j} J_{ij}\hat{S}_i^z\hat{S}_j^z - \Omega\sum_i \hat{S}_i^x,$$

where $\hat{S}_i^\mu (\mu \in \{x, y, z\})$ are spin-½ operators, and $J_{ij} > 0$ is the interaction strength between spins at site-i and j with characteristic strength $J \sim \Sigma_j J_{ij}$ According to some embodiments, the spins can also be driven by fast, global, periodic $\pi$-pulses, $P=\exp[-i\pi \Sigma_i \hat{S}_i^x]$, that rotate each spin around the $\hat{x}$ axis. For example, applications of strong microwave or optical pulses can be used to realize such $\pi$-pulses. For B=0 (e.g., for measuring small fields that can be considered a small perturbation on a zero-field scenario), the dynamics can be driven by a Floquet unitary $\hat{U}_F = \hat{P} e^{-2\pi i \hat{H}_0 \tau}$, where $\tau$ is the time-duration between $\pi$-pulses, setting the Floquet frequency, $\omega_0 = 2\pi/\tau$. Using the sensing protocol described below, the strength of the small magnetic field signal, B can be measured.

As shown in FIG. 1C, the sensing protocol includes at least three steps: initialization 120, measurement 130, and read-out 140. FIG. 1C shows the transverse field strength $\Omega$, the $\pi$-pulses 150 (i.e., driving pulses), and signal oscillations 110 as a function of time. In the initialization step 120, the spins are first polarized by application of a strong transverse field ($\Omega \gg J$) in a direction of the transverse field $\Omega$ the region 122 of FIG. 1C. As shown in FIG. 1D, this prepares the spins in a polarized configuration 124 in the transverse direction (i.e., along transverse field $\Omega$).

After polarizing the spins, the transverse field $\Omega$ can be subsequently decreased in ramp segment 126 to zero over time duration $T_p$. During this process, $\pi$-pulses can be applied at a driving frequency $\omega_0$ (e.g., Floquet frequency) that is sufficiently detuned from $2\omega_s$ such that the effect of $\hat{H}_{signal}$ on the spin dynamics is negligible. In other words, as the transverse field $\Omega$ is ramped down, the $\pi$-pulses are applied at a sufficiently different rate such that the signal does not significantly affect the spin states of the many-body spin system. Accordingly, a strongly entangled state, such as the GHZ state discussed in more detail below, can be prepared for the measurement step 130.

As discussed above, the sensitivity of such an entangled state to observable quantities such as AC magnetic fields can be reduced by interactions between the quantum spins and noise. Accordingly, in the measurement step 130, the Floquet frequency is adjusted to be resonant with the signal, $\omega_0 \approx 2\omega_s$ while the system evolves for a time duration $T_s$ under zero transverse field 132. During this time evolution, the information about the strength of the signal at frequency $\omega_s$ becomes recorded as a relative phase $\phi$ between two many-body quantum states $|\uparrow\uparrow \ldots \uparrow\rangle$ and $|\downarrow\downarrow \ldots \downarrow\rangle$, as indicated in FIG. 1E.

Finally, in the read-out step 140 the initialization step 120 is reversed over a time $T_r$ in ramp segment 146. Afterward, and each spin's polarization is then measured along the $\hat{x}$ axis in the segment 142. For example, the parity across the entire many-body quantum spin system can be determined by applying laser light (e.g., at 532 nm) to the quantum spins and collecting the responsive fluorescence signal at 637 nm. The parity can be indicative of a number of a number of quantum spins 128 that have flipped (shown in FIG. 1F) during the measurement phase 130. However, any known measurement technique can be used to determine the spin states. The fluorescence signal can be collected via an avalanche photodetector (APD), a single photon counting module (SPCM) for spatially resolved measurement, or any other types of photodetectors.

According to some embodiments, three steps 120, 130, and 140 can be completed within the relevant coherence time of the system ($T_2$), such that $T_2 \geq T_p + T_s + T_r$. Furthermore, the steps can be repeated over a total integration time T. As discussed below, the magnetic field signal can be extracted from the average parity, $\langle \hat{P} \rangle \propto \Pi_i \langle \hat{S}_i^x \rangle$. In each step, the driving frequency $\omega_0$ can be dynamically changed to different values using the process described with reference to FIG. 1C. Since the driving frequency determines the signal frequency strength at a particular frequency, sweeping the driving frequency over a plurality of steps 120, 130, and 140 can be used to develop a signal spectrum. Each repetition of steps 120, 130, and 140 can constitute a spectroscopy at a particular frequency $\omega_s$ over an integration time $T_s$. Accordingly, the bandwidth $1/T_s$ of each measurement can be broader compared to the bandwidth of a spectroscopic method using unentangled spins in product states, which is determined by the decoherence rate that can be limited by many-body interactions. Thus, the sensor's sensitivity to a range of frequencies across a broad bandwidth can be increased. According to some embodiments, the range of sweep for frequency $\omega_s$, can be limited by $\omega_s \gg J$.

In order to understand how sensitive parity changes are as a function of signal strength, the dynamics in each of the three exemplary steps 120, 130, and 140 are analyzed in detail. During the initialization step 120, Ising interactions among spins can be used to prepare a quantum state with strong spin-spin correlations between constituent quantum spins. To understand the dynamics during state preparation, the so-called toggling frame can be moved, which rotates with every $\pi$-pulse, $\hat{P}$, by applying the unitary transformation $\hat{H} \mapsto \hat{P}^{-1} \hat{H} \hat{P}$. In this frame, $\hat{H}_0$ remains invariant while $\hat{H}_{signal}$ changes sign during every Floquet period, modifying the time-dependence of the original signal to $B_{eff}(t) = B \sin(\omega_s t)\theta(\omega_0 t/4\pi)$, where $\theta(x)$ is a square function with unit period. The dynamics of such a system can be well approximated by an effective, quasi-static Hamiltonian:

$$\hat{D} = \hat{H}_0 + \overline{B}_{eff} \sum_i \hat{S}_i^z \quad (2)$$

where $\overline{B}_{eff}$ is the time-averaged signal strength and a small correction of order $\sim O(B\Omega/\omega_s)$ has been neglected. When $\omega_0$ is far-detuned from $2\omega_s$, $B_{eff}(t)$ rapidly oscillates with vanishing mean. The polarized initial state 124 corresponds to the ground state of $\hat{D}$, for large $\Omega$. As $\Omega$ is slowly decreased to zero, the system undergoes a phase transition from a paramagnet to a ferromagnet with two degenerate ground states $|G\pm\rangle = (|\uparrow\uparrow \ldots \uparrow\rangle \pm |\downarrow\downarrow \ldots \downarrow\rangle)/\sqrt{2}$. During this process the effective Hamiltonian conserves parity and hence, for a sufficiently slow ramp, the initialization along segment 126 deterministically prepares the even parity Greenberger-Horne-Zeilinger (GHZ) state, $|G+\rangle$.

During the measurement step 130, tuning the driving frequency to $\omega_0 = 2\omega_s$ can give rise to a non-zero time-averaged signal strength $\overline{B}_{eff} = (2/\pi)B$. which resonantly couples the two degenerate ground states ($|G\pm\rangle$), inducing coherent oscillations between them. After time evolving for $T_s$, the system is in a superposition $|G\phi\rangle = \cos(\phi)|G_+\rangle - i\sin(\phi)|G_-\rangle$, where $\phi = 2N\overline{B}T_s$ is the collective phase accumulated by the spin ensemble during the measurement sequence. This phase can be extracted from by measuring the parity $\langle \hat{P} \rangle = \cos(2\phi)$ in the paramagnetic phase, since $|G_-\rangle$ is adiabatically mapped to a single spin excitation, while $|G_+\rangle$ maps to zero excitations (compare FIG. 1F with one excitation 128 and FIG. 1D with no excitations in state 124).

According to some embodiments, the sensitivity can be estimated for an exemplary ideal case without noise. When the protocol described above with reference to FIGS. 1C-1F is repeated $k = T/T_2$ times, the uncertainty in the phase is reduced to $\delta\phi \sim 1/\sqrt{k}$. Assuming a long measurement duration, $T_2 \approx T_s \gg T_p, T_r$, the sensitivity can scale as:

$$\delta B^{-1} \sim \delta\phi^{-1} NT_s \sim N\sqrt{T_2 T}, \quad (3)$$

saturating the Heisenberg limit. Note that the relevant coherence time here can be determined by noise at the probing frequency $\omega_s$ (and is not limited by interactions between the spins).

According to some embodiments, the initialization process in 120 can be closely related to adiabatic preparation of strongly correlated (entangled) quantum states. In such a method, the Hamiltonian of a quantum system can be slowly tuned, such that the system belongs to a certain quantum phase of matter (e.g. paramagnetic phase) at the beginning and to another quantum phase (e.g. ferromagnetic phase) at the end. If the system starts out in the ground state of the first phase, it can be evolved so as to end in the ground state of the second phase. The fidelity of this method of preparing a quantum state (the ground state of the second phase) can depend on how fast the Hamiltonian parameters are tuned compared to the energy gap (see below). In particular, when the system size, N, is large, the fidelity of the state preparation is limited by the small energy gap of the effective Hamiltonian D at the phase transition point (e.g., the boundary between ferro- and para-magnetic phases). This energy gap can be defined by the difference in energies between the ground state(s) and the first excited states of the Hamiltonian D, and can be distinct from quasi-energy gap in FIG. 1A. When the system size N increases, the energy gap generally decreases. Accordingly, a small energy gap can lead to smaller fidelity of the quantum state preparation.

According to some embodiments, the protocol described above may be limited by the adiabatic preparation fidelity of the GHZ state. The phase transition can be between paramagnetic phase when $\Omega$ is large and ferromagnetic phase when $\Omega$ is small. When $\Omega$ is ramped sufficiently slow, a strongly correlated quantum state can be prepared. The fidelity of this state preparation method can depend on so-called the energy gap, which is in turn related to the system size N. The energy gap, or the transition energy from one state to another as shown in FIG. 1A, at the phase transition decreases as the system size increases. A smaller energy gap requires a longer preparation step because the ramping of the transverse field $\Omega$ can be accomplished sufficiently slowly compared to the energy gap. In turn, longer preparation steps require a longer coherence time to allow for such a long preparation step because $T_2 \geq T_p + T_s + T_r$ should be satisfied in order to complete the measurement within the coherence time. By crossing a phase transition in limited time, one necessarily creates a finite density of excitations, which results in a state after the ramp segment 126 that is different from the GHZ state. However, even in this non-GHZ state, where ferromagnetic take the place of spin-spin correlations, the protocol described above can still achieve a sensitivity better than that of the standard quantum limit (SQL), which can refer to the sensitivity scaling discussed above when $T_2$ is limited by the interaction time J. In some embodiments $\bar{T}_2$ can be larger than $T_2$, such that the sensitivity is beyond SQL. These correlations can be characterized (or quantified) by a length scale $\xi$, where $\langle \hat{S}^Z_i \hat{S}^L_j \rangle \sim e^{-|i-j|/\xi}$ and can be estimated from Kibble-Zurek scaling as $\xi \sim (JT_p)^{\nu/(1+z\nu)}$. Here, z and v are the correlation-length and dynamical critical exponents of the transition. Since the above-described state is not exactly the GHZ state, the correlation length $\xi$ can be used to describe the correlation of the system. In the equivalent GHZ state, $\xi$ would be equal to the system size.

In this exemplary scenario, the initialization step 120 prepares an even parity state of the form $|\xi_+\rangle = (|\xi\rangle + P|\xi\rangle)/\sqrt{2}$, where $|\xi\rangle$ is ferromagnetically ordered with correlation length $\xi$. The state accumulates a collective phase $\phi = 4BT_s \Sigma_i \hat{S}^Z_i$ during the measurement stage 130, leading to a parity expectation value $\langle \hat{P} \rangle = \langle \xi | \cos(2\phi) | \xi \rangle$. For a weak signal, $\langle \hat{P} \rangle$ varies quadratically as: $1 - \langle \hat{P} \rangle \approx 2 \langle \xi | \phi\phi | \xi \rangle \sim \xi^d N (BT_s)^2$, which results in a sensitivity scaling $$\delta B^{-1} \sim \sqrt{T/(T_p + T_s + T_r)} \sqrt{\xi^d N} T_s. \quad (4)$$

This scaling can be understood as follows: the state $|\xi_+\rangle$ can be viewed as multiple copies of a GHZ state with size $\sim \xi^d$. While each GHZ state allows Heisenberg-limited sensitivity $\sim \xi^d \sqrt{T T_2}$, simultaneous measurements with all $N/\xi^d$ copies can further improve the signal to noise by a factor leading to the observed scaling in Eq. (4). When the correlation length approaches the system size, this scaling improves to reach the limit in Eq. (3).

Given a limited coherence time in which the measurement can take place, the relative duration of each step (e.g., segment 126, measurement step 130, and segment 146) can be optimized. According to some embodiments, the optimum can be achieved when $\beta = T_p/T_2 \approx 1 - T_s/T_2 = (1 + 2(\nu z + 1)/d\nu)^{-1} >> T_r/T_2$. In this example, $\beta$ described the ratio between the preparation time Tp and the measurement time $T_2$. For example, in one dimension with nearest neighbor interactions, the phase transition is characterized by exponents $\nu, z = 1$, and the optimized sensitivity scales as $$\delta B^{-1} \sim \sqrt{NTT_2}(JT_2)^{1/4}. \quad (5)$$

This scaling can improve upon the SQL by a factor $\sim (JT_2)^{1/4}$.

Accordingly, as discussed above and further below, periodic π-pulses as used in this exemplary protocol can assist in suppressing low frequency noise and preventing changes to the parity of the spin ensemble. This protection originates from the quasi-energy gap between pairs of Floquet eigenstates (eigenstates of a Floquet unitary evolution over one cycle) with opposite parity as shown in FIG. 1A.

Figure 2:
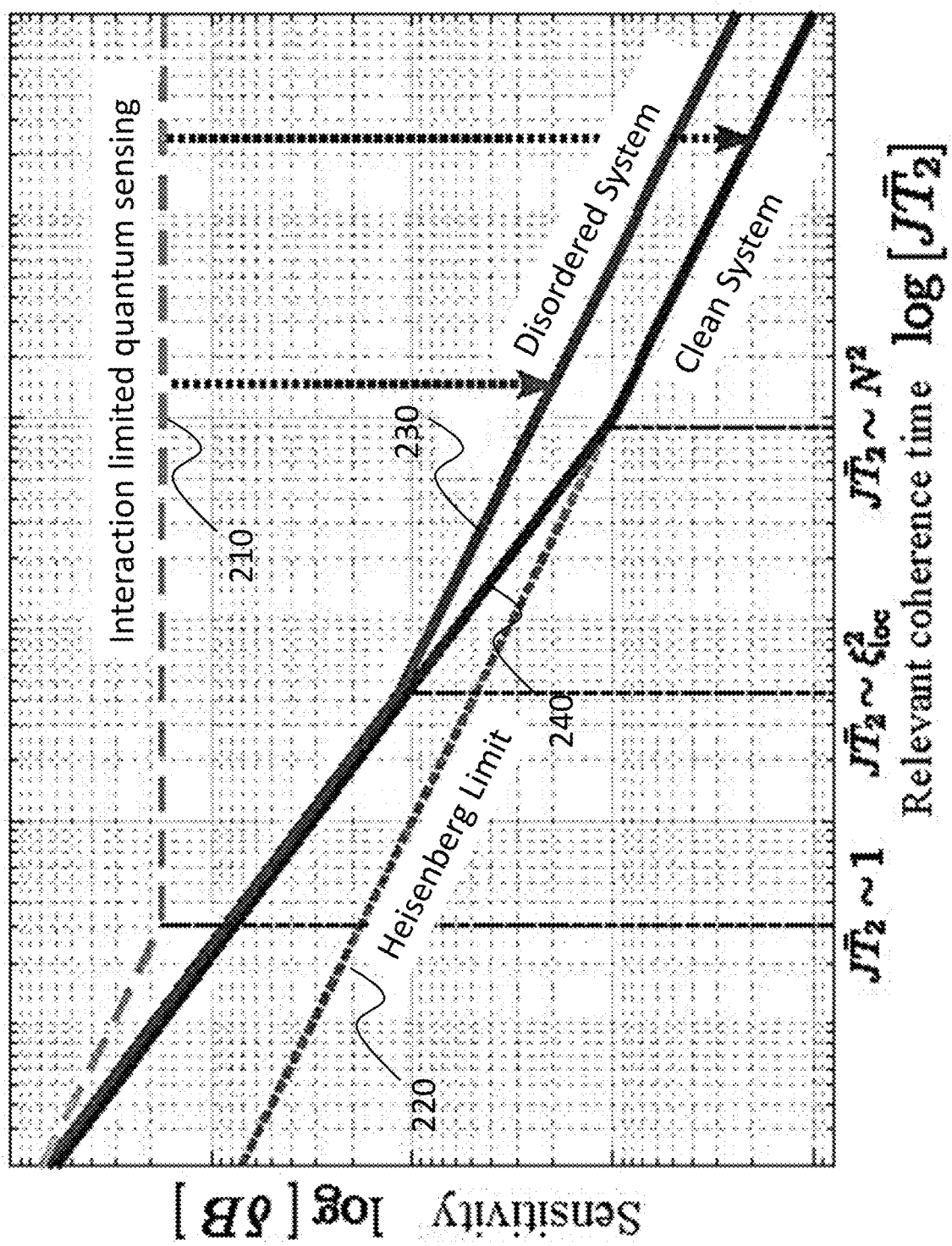
FIG. 2 shows sensitivity scaling $\delta B$ as a function of $T_2$ according to some embodiments.

FIG. 2 shows the sensitivity scaling $\delta B$ as a function of $T_2$ for a given system size N and total integration time T. In particular, FIG. 2 shows the sensitivity (log[$\delta B$]), where $\delta B$ denotes the minimal strength of signal that can be detected or equivalently the minimal difference between two magnitudes $B_1$ and $B_2$ such that $\delta B = |B_1 - B_2|$, so that $B_1$ and $B_2$ can be distinguished using the disclosed technique, of the clean system 240 and disordered systems 230 as a function of coherence time ($\log[JT_2]$) under certain exemplary conditions. As shown in FIG. 2, longer coherence times produce a lower (better) sensitivity. FIG. 2 further shows the Heisenberg limit 220 to sensitivity for any given coherence time. As examples, the lines 230, 240 shown in FIG. 2 were determined assuming a system comprising a spin chain with short-range interactions. As shown in FIG. 2, the sensitivity of such a system can approach Heisenberg limit when $T_2$ is sufficiently long to prepare a GHZ state, e.g. $JT_2 > N^2$. For a disordered system, as plotted on line 230, this scaling is limited because the maximum correlation length $\xi$ is restricted Anderson localization of quasi-particles with the localization length $\xi_{loc}$ discussed above. More specifically, according to some examples, for a disordered system, quasi-particles are localized within $\xi_{loc}$, which provides the upper limit to $\xi$. In both cases, the protocol outperforms standard quantum limit 210, where the coherence time is limited by inter-particle interactions.

Robustness:

The following characterizes the exemplary robustness of some embodiments of the disclosed protocol in the presence of imperfections and/or noise. As discussed in more detail below, embodiments of the disclosed protocol can still present significant improvements in sensitivity in the face of such imperfections and noise.

First, considering the quasi-static local perturbations, $\in \Sigma_i \delta \hat{H}_i$, which can be decomposed into parity-preserving and parity-changing terms: $\delta \hat{H}_i = \delta \hat{H}_i^+ + \delta \hat{H}_i^-$ with $\delta \hat{H}_i^{\pm} = (\delta \hat{H}_i \pm \hat{P} \delta \hat{H}_i \hat{P})/2$. According to some embodiments, the parity-preserving term, $\delta \hat{H}_i^+$, does not affect the nature of the phase transition nor the sensitivity scaling of the exemplary protocol. The parity-changing term, $\delta \hat{H}_i^-$, can, in some embodiments, hinder both the state preparation and the measurement fidelity of the magnetic field signal. However, this effect can be parametrically suppressed by the presence of the periodic π-pulses discussed throughout the present disclosure, which effectively "echoes" out this contribution to leading order. More specifically, higher order corrections to the effective Hamiltonian appear only as $\sim \in J/\omega_0$ and can be safely neglected assuming $\in J/\omega_0 << (\xi^d T_P)^{-1}$ (initialization) and $\in J/\omega_0 << B$ (measurement) Under these conditions, the effects of higher order corrections can be small enough compared to the effects of smallest signal to be measured.

Second, according to some embodiments, the presence of inhomogeneities in $\delta \Omega_i$, $\delta J_i$, and $\delta \theta$ (slight variations in the transverse field, ferromagnetic interactions between spins, and spin rotations with respect to average values) can lead to (Anderson) localization, which limits the maximum correlation length of the system. In general, the localization length at the critical point (e.g., boundary between paramagnetic and ferromagnetic phases) scales as $\xi_{loc} \sim (W/J)^{-\mu}$, where W is the disorder bandwidth, or degree of deviations (in this context, it can be said that W is given as the standard deviations of $\delta \Omega_i$, $\delta J_i$ or $\delta \theta \omega_0$) of the coupling parameters and μ is the corresponding critical exponent. When the localization length $\xi_{loc}$ is shorter than the original correlation length $\xi \sim \sqrt{JT_P}$, the state preparation time should be reduced to $T_p^* = (W/J)^{-2} \mu/J$ (so that more time can be allocated for the measurement step). This leads to a modified sensitivity scaling as summarized by the disordered system 230 in FIG. 2.

Finally, the effect of noise from the environment can also be considered, which can limit the coherence time, $T_2$. Given a noise spectral density $$S(\omega) \sim \frac{A_0^{1+\alpha}}{\omega^\alpha},$$

where α is a power describing how spectral density decays as a function of frequency ω, and $A_0^{1+\alpha}$ is a suitable normalization constant, the periodic π-pulses described throughout the present disclosure can decouple the system from low frequency noise $\omega < \omega_s$, implying that the decoherence rate is determined by the noise density at the probe frequency, $S(\omega_s)$. If the noise on each spin is independent, then the relevant coherence time of the entangled spin state is shortened to $T_2 \sim T_2^0/\xi^d$ where $T_2^0$ is the lifetime of a single spin and $\xi^d$ is the size (number) of correlated spins. More specifically, ξ can be the correlation length discussed above, and d can be the dimension of the system. In combination, $\xi^d$ can describe the number of correlated spins. In this case, the reduction of the coherence time can off-set potential gains in the sensitivity in Eq. (4). However, even in such an embodiment where noise is independent for each quantum spin, the disclosed protocol still benefits from a shorter measurement duration $T_s$ (since the phase shift caused by the external signal to be measured is accumulated N times faster in $|G_\phi\rangle$), which provides a broader sensing bandwidth without compromising the sensitivity. Finally, for solid-state spins, noise often arises from nearby fluctuating dipole moments, which generates a spatially correlated $S(\omega)$. In this case, $T_2$ can be significantly longer than $T_2^0/\xi^d$ owing to spatial averaging of the noise field in the collective phase $\phi = 4BT_s \Sigma_i \hat{S}_i^z$, leading to an enhanced sensitivity. Thus, the improvements produced by the periodic driving during the measurement phase 130 discussed in the present disclosure frequently go beyond those caused by faster accumulation of phase during the measurement phase.

Exemplary Sensing Protocol without Parity Measurements:

According to some embodiments, parity measurements can become challenging in an ensemble experiment where resolution of individual spin projections cannot be performed. To this end, an alternative exemplary approach to implementing the disclosed protocol can be based upon measuring an extensively scaling observable, which, in this context, can refer to an observable with a value that scales linearly with the system size. For example, a parity (the value of which can be plus or minus one) of spins does not scale with system sizes, according to some embodiments, but the number spin up states can scale with system sizes. Embodiments of this exemplary modified protocol are shown in FIG. 3A.

As shown in FIG. 3A, the disclosed protocol can include similar initialization, measurement, and read-out steps 320, 330, and 340, respectively to those shown in FIG. 1A. During the initialization step 320, the quantum spins are first polarized in a transverse field Ω in the region 322. The transverse field Ω is then adiabatically decreased along the segment 326 such that it comes close to (e.g., within ΔΩ of) the critical point $\Omega_c$ such that $\Omega = \Omega_c + \Delta\Omega$ without crossing the phase transition. As discussed above, unwanted quasi-particle excitations can occur at the phase transition. Accordingly, decreasing the transverse field Ω to just above the critical point avoids creating unwanted quasi-particle excitations. In addition, during the segment 326, π-pulses 350 are applied to quantum spins at a frequency $\omega_0$ that is systematically detuned from the signal frequency $\omega_s$, as described below.

Figure 3B:
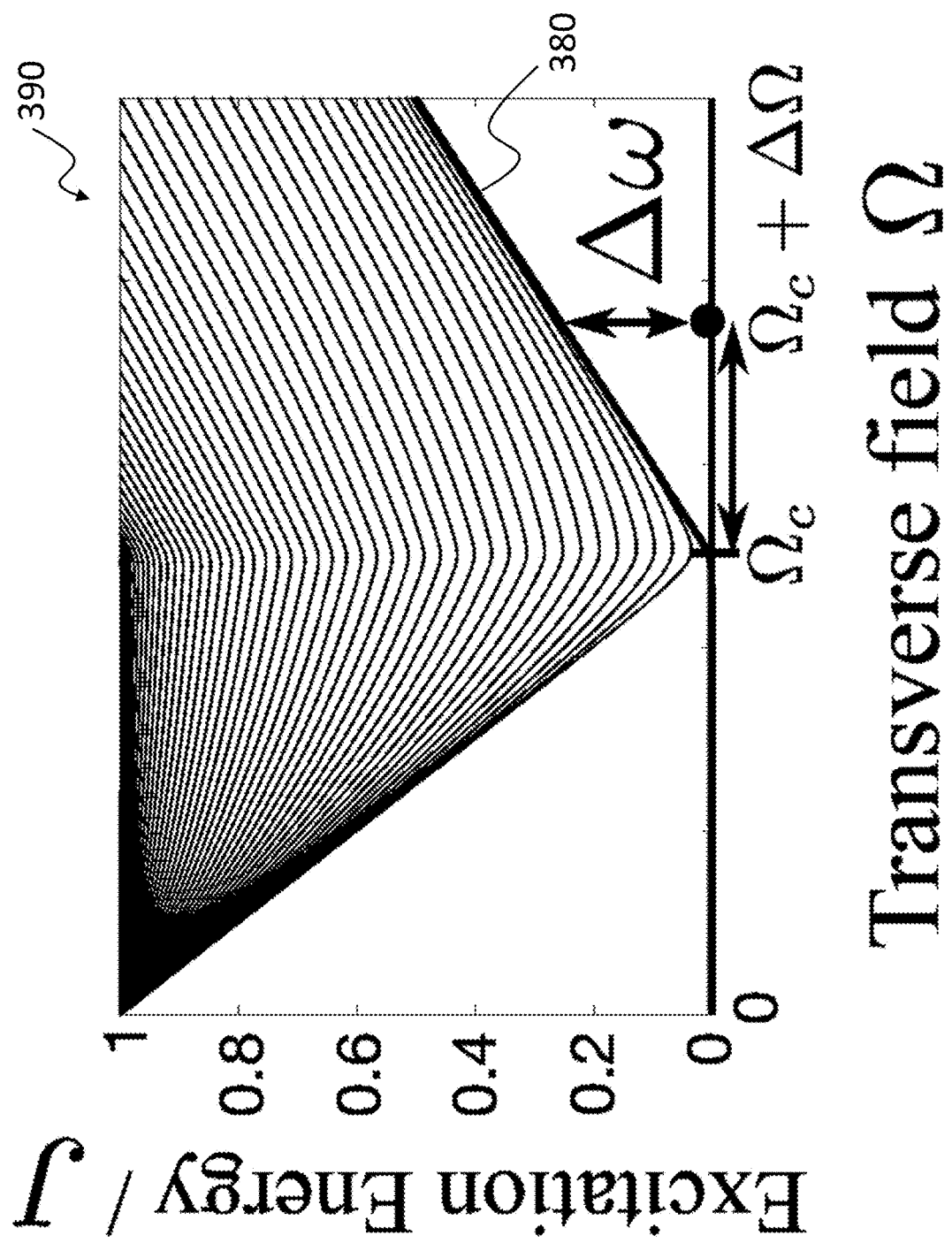

In the measurement step 330, the transverse field remains at the level in segment 332. In addition, rather than setting the Floquet frequency equal to $2\omega_s$, as discussed in relation to FIG. 1A, it can instead be detuned by $\Delta\omega \equiv \omega_s - \omega_0/2$, such that the magnetic field signal to be measured resonantly excites the system. FIG. 3B shows an exemplary excitation spectrum of $\hat{H}_0$ for an exemplary quantum spin system comprising a short-range interacting spin chain such that only nearest neighboring pairs interact with the strength J. In particular, FIG. 3B shows the excitation energy $\hat{H}_0$ of the system (normalized for the interaction energy J) as a function of the transverse field Ω during the measurement phase. Lines 380 and 390 depict the excitation energies for different quasi-particle excitations. In the vicinity of the critical point $\Omega_c$, the effective signal resonantly excites the system and create quasi-particle excitations when Δω is matched to the lowest excitation energy indicated by line 380.

Figure 3C:
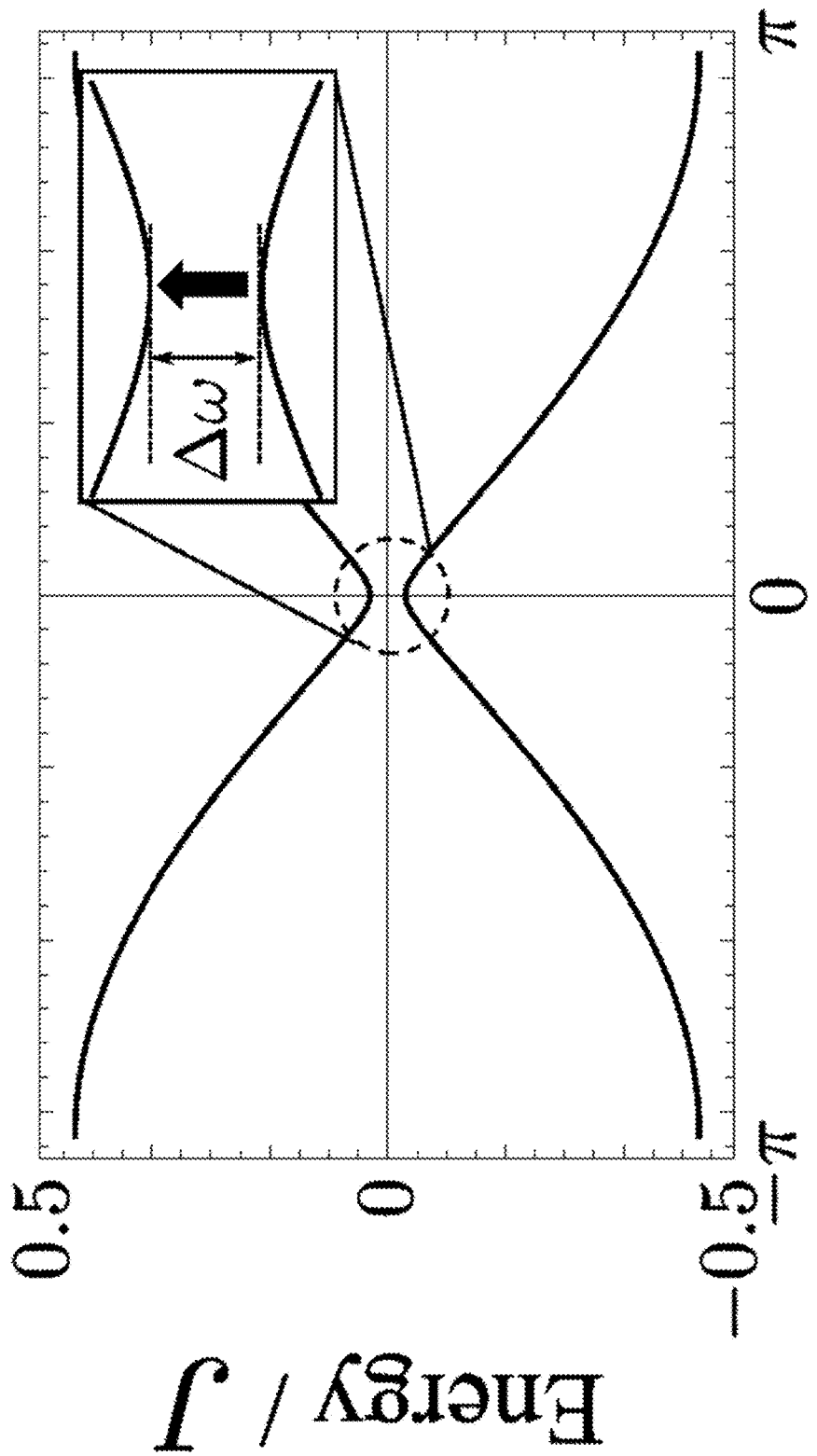

FIG. 3C shows the dispersion relation of Bogoliubov quasi-particle excitations for an exemplary short-range interacting spin chain. Two lines 360, 370 represent the energies for the presence and the absence of quasi-particle excitations with different (quasi-)momentum k. The difference between two lines corresponds to the amount of energy required to create one quasi-particle at the corresponding quasi-momentum k. Low momentum modes are resonantly excited by the signal when Δω is matched to the excitation energy.

Finally, in the segment 346 of the read-out phase 340, Ω is slowly brought back to its original value in the segment 346. After the segment 346, the number of spin-flip excitations, $N_e$, encodes the signal strength B. This can be read from the magnetization $\Sigma_i \hat{S}_i^x$. The measurement of magnetization can be achieved by, for example, differential fluorescence measurements, or any other exiting methods to read out spin states of a quantum spin ensemble. For example, reading out the state of the ensemble of quantum spins can be performed with one or more of an avalanche photodetector (APD) or a single photon counting module (SPCM).

In some embodiment, the resonant magnetic field signal creates, on average, a single collective excitation within the correlation volume (in number of quantum spins), $\xi^d$. In other words, each correlation volume comprising multiple quantum spins over the correlation distance scale is excited into a collective excitation state. The probability of creating such an excitation, $p \sim (\chi \xi^{d/2} BT_s)^2$, in a given correlation volume depends on the proximity of the transverse field to the critical point during the measurement stage 330, which leads to the enhancement factor (e.g., how the susceptibility has been enhanced due to quantum correlation), $\chi = (\Delta\Omega/\Omega)^{-\eta}$, where η is the scaling dimension of the operator $\hat{S}_i^z$. Since there are $N/\xi^d$ correlated spin segments in the system, the average number of excitations $N_e \sim pN/\xi^d$. This number fluctuates such that $\delta N_e \sim \sqrt{p(1-p)N/\xi d)}$. These fluctuations result in a signal-to-noise ratio of $\partial_B N_e/\delta N_e \sim \sqrt{NT_s(JT_p)^{\eta/(zv+1)}}$. As before, when this procedure is repeated over a total duration T with an optimal Tp (with respect to $T_2 \geq T_p + T_s + T_r$), the sensitivity scales as, $$\delta B^{-1} \sim \sqrt{NTT_2}(JT_2)^{\eta/(zv+1)}. \tag{6}$$

For nearest neighbor interactions in 1D (Ising universality class), the scaling dimension is η=⅜ and $\delta B^{-1} \sim \sqrt{NTT_2(JT_2)^{3/16}}$. It should be appreciated that different configurations can be used.

Exemplary Implementations:

the measurement protocol, including preparation into a strongly correlated state, driving at a Floquet frequency during exposure to an external oscillating signal source, and observing the resulting system as described throughout the present specification can be used in a number of applications. For example, it can be implemented as an AC magnetic field sensor using a 2D array of spin centers within a crystal lattice, such as shallowly implanted nitrogen-vacancy (NV) color centers in diamond. According to some embodiments, the sensitivity per unit area in this exemplary approach can be limited by the dipolar interactions between the S=1 NV centers, which are difficult to decouple using conventional NMR techniques. However, the protocol of the present disclosure provides a way to circumvent this interaction-induced limitation and enable significant improvements to the sensitivity by preparing the NV centers in a strongly correlated state, such as the GHZ state, and driving them with $\pi$-pulses as described above to stabilize them for measurement of a particular frequency signal, such as an AC magnetic signal. Since NV centers are also sensitive to signals such as AC electric fields and rapidly oscillating temperatures, such a method could also be implemented to measure such signals.

A second exemplary platform for implementing the disclosed protocol can include nuclear spin ensembles in layered materials, such as, but not limited to hexagonal boron-nitride (for example with boron isotope quantum spins) or $^{13}$C enriched graphene (for example with $^{13}$C quantum spins), or other materials which may include quantum spin degrees of freedom. Similar techniques in which the quantum spins are prepared in a strongly correlated state, driven with periodic microwave or radio-frequency (RF) pulses to reduce the destabilizing effects of noise during a measurement phase, and subsequently read out. A person of ordinary skill in the art would understand based on the present disclosure that such quantum spins may be sensitive to different oscillating signals, and thus that the steps in the disclosed protocol can be adapted to analogous control techniques for different quantum spins in order to measure such oscillating signals. According to some embodiments, applications of such systems can include the detection of time-varying signals (such as vibrations caused by scattering) resulting from weakly interacting massive particles such as axions.

The disclosed protocol can also be extended along several directions. While the above examples focused on probing the strength of field signals, such as magnetic fields, similar protocols can enable the detection of phase fluctuations in the external control driving itself. For example, the effects of fluctuations in control driving is equivalent to those of time-dependent signals, which can be detected by the disclosed technique. Moreover, the protocol allows for the suppression of symmetry breaking perturbations at leading order via periodic pulses, such as $\pi$-pulses.

Exemplary Characterization of the Effects of Disorder

The protocols described above can utilize quantum phase transitions to develop long-range spin correlations. In an exemplary ideal case, the spin correlation length $\xi$ reaches the linear system size (e.g., the full many-body quantum spin system size) at the critical point of the phase transition, and our initialization step prepares Greenberger-Horne-Zeilinger (GHZ) states, allowing Heisenberg limited quantum sensing. In the presence of disorder, however, $\xi$ may be limited as the disorder can, in some embodiments, prevent the propagation of spin correlations by localizing quasi-particle excitations. In turn, the limited spin correlations lead to diminished sensitivity enhancement compared to Heisenberg limit. As an example, below the effects of such disorder for a spin chain with nearest neighbor Ising interactions are quantified.

According to some embodiments, it can be assumed that the transverse field strength at each spin is weakly disordered such that the transverse field $\Omega_i$ at any given quantum spin can be given by $\Omega_i = \Omega + \delta\Omega_i$, where $\Omega$ is the average field strength and $\delta\Omega$ is a random variable uniformly distributed from $[-W/2, W/2]$. Likewise, it can be assumed that the interaction strength for any given spin can be given by $J_i = J + \delta J^i$, where $\delta J_i$ is uniformly distributed from $[-W/2, W/2]$. Under such assumptions, local fluctuations in $J_i$ would also be random. Without loss of generality, the imperfection and disorder in the spin rotation angle $\delta\theta_i$ can be regarded as a part of $\delta\Omega_i$ because their effects can be equivalent in the effective Hamiltonian description.

According to some embodiments, in order to quantify the localization length $\xi_{loc}$ of quasi-particles excitations at the critical point, the effective Hamiltonian can be numerically diagonalized. For example, the effective Hamiltonian during the initialization step, $D = -\Sigma_i \ J_i S_i^z S_{i+1}^z - \Sigma_i \Omega_i \hat{S}_i^x$, can be mapped to a quadratic fermionic Hamiltonian using Jorndan-Wigner transformation: $c_i^\dagger = (\Pi_{j=1}^{i-1} S_j^x)(S_i^z - iS_i^y)$ and $c_i = (\Pi_{j=1}^{i-1} S_j^x)(S_i^z + iS_i^y)$. This leads to $D = \Sigma_{ij} (c_i^\dagger) H_{ij} (c_i c_i^\dagger)^T$, where the single particle Hamiltonian $H_{ij}$ can be written as $$H_{ij} = \delta_{ij} \begin{pmatrix} -\frac{\Omega_i}{2} & 0 \\ 0 & \frac{\Omega_i}{2} \end{pmatrix} + \frac{1}{8}\delta_{i+1,j}\begin{pmatrix} J_i & J_i \\ -J_i & -J_i \end{pmatrix} + \frac{1}{8}\delta_{i,j+1}\begin{pmatrix} J_j & -J_j \\ J_j & -J_j \end{pmatrix}. \tag{S1}$$

In an example, the system can include an even number of particles up to N=3000 in the even parity sector P=1 with a periodic boundary condition (which can correspond to the anti-periodic boundary condition for free fermions, i.e. $C_{N+1} = -C_1$). The single particle $H_{ij}$ can be numerically diagonalized at the critical point $\Omega = J/2$.

Figure 4:
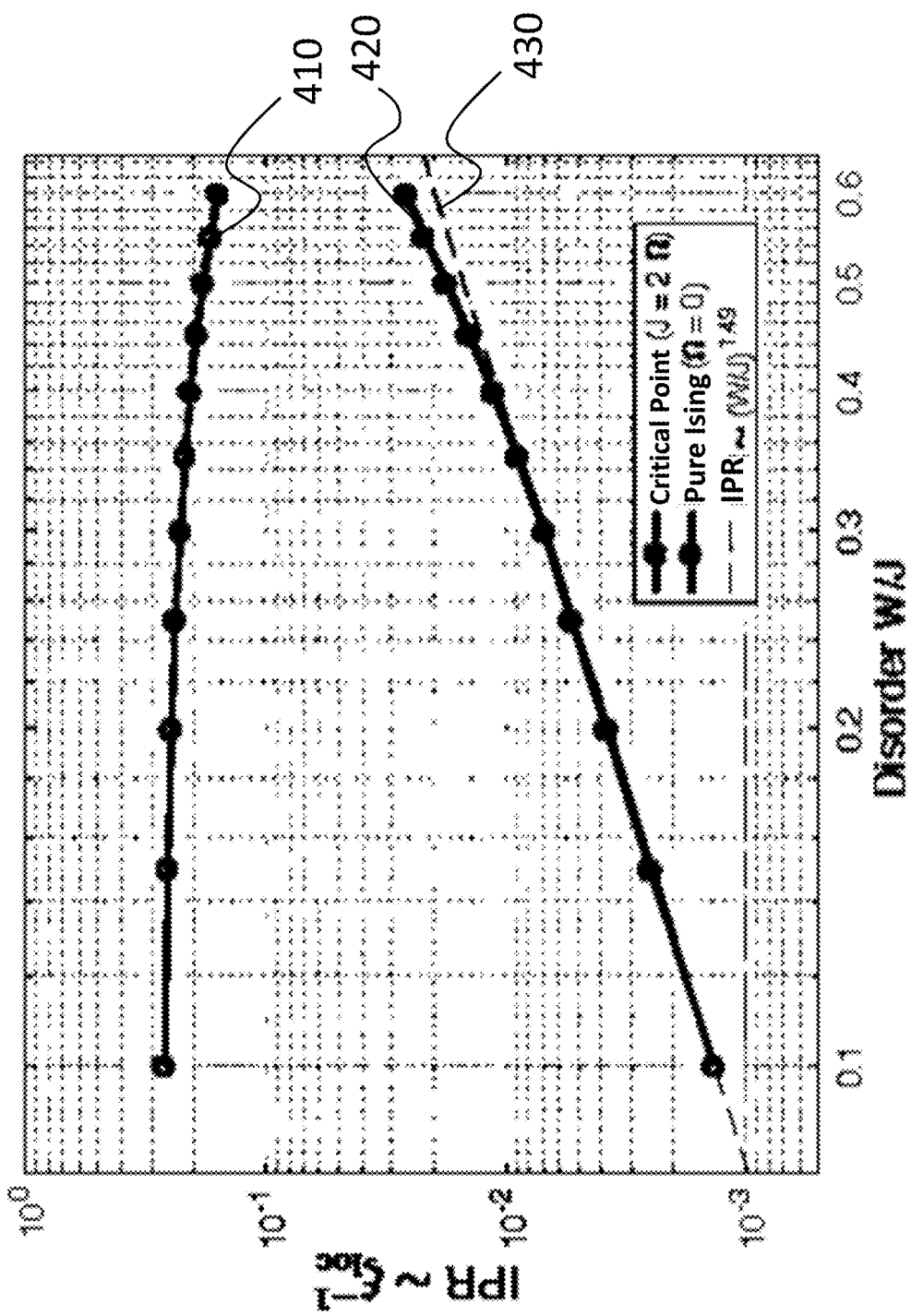
FIG. 4 shows the average inverse participation ratio as a function of disorder, according to some embodiments.

As a proxy for an inverse localization length $\xi_{loc}^{-1}$, the average inverse participation ratio (IPR) $\xi_{loc}^{-1} \approx \text{IPR} = \langle \Sigma_i |\psi_i|^4 \rangle$ can be computed to quantify the (inverse) localization length (which can limit achievable correlation length), where $\psi_i$ is the quantum amplitude of an eigenstate at site-i, and $\langle \cdot \rangle$ denotes averaging over 50 instances of disorder realizations, which imply various sets of randomly selected values, and over 50 energy eigenstates (closest to zero energy) per disorder realization. FIG. 4 plots the average inverse participation ratio as a function of disorder. At the phase transition point ($\Omega = J/2$, line 410), the spatial extents of localized quasi-particle excitations are larger in orders of magnitudes than those during the measurement step ($\Omega = 0$, line 420). As shown in FIG. 4, the localization length scales as $\xi_{loc}^{-1} \sim (W/J)^\mu$. The exponent can be numerically extracted from the fitted curve (line 430), which results in $\mu \approx 1.49$. During the measurement step (line 420), the tight localization of quasi-particles is favorable for a stable accumulation of phase information.

The effects of disorder can become favorable during the read-out step. According to some embodiments, without disorder, domain wall excitations in one dimension can be mobile, can hinder coherent accumulation of phase information over a long time. If the localization lengths during the measurement step ($\Omega = 0$) are much shorter than those at the critical point, domain wall excitations become immobile, allowing more stable accumulation of the phase information from the signal. Repeating the numerical calculations at $\Omega = 0$, the localization length can be multiple orders of magnitude shorter during the measurement step than at the phase transition point (see FIG. 4 with lines 410 and 420).

In these numerical calculations, two types of disorder ($\delta J_i$ and $\delta\Omega_i$) are characterized by the same disorder strength W. However, in some exemplary implementations, disorder in J is can be much stronger than that of $\Omega$, since the dominant source of disorder can in some examples arise from random positioning of spins. This, however, is even more favorable to the disclosed protocol because it can lead to more stable coherent accumulation of phase information during the measurement step while the correlation length is less limited.

Exemplary Broad-Band Sensing Using Correlated Spin States

As discussed in more detail below, the disclosed protocol presents significant improvements in broad-band sensing. This is because the disclosed protocol maintains increased sensitivity over a broad range of frequency values. Thus, the disclosed protocols are well suited for applications that require both high sensitivity to faint signals and a large bandwidth to detect unknown signals that may be present in a large frequency range.

The detection of a weak signal at an unknown frequency can require a highly sensitive spectroscopic method with a large bandwidth. Such technique is often needed in the study of fundamental physics, such as the detection of gravitational waves or weakly interacting massive particles. In a conventional spectroscopic method, the increase in bandwidth entails the decrease in detection sensitivity. In other words, sensitivity (the ability to detect small signals) and bandwidth (the ability to detect signals over a large range of frequencies) are considered a tradeoff. For example, as discussed above, the standard quantum limit (SQL) of N non-interacting particles can lead to the sensitivity scaling:

$$\delta B^{-1} \sim \sqrt{NTT_2}, \quad (S2)$$

where $\delta B$ is the minimum detectable signal strength, $T_2$ is the duration of each measurement cycle, and T is the total integration time. The bandwidth $\delta\omega$ of this exemplary method is Fourier limited to the measurement duration $\delta\omega \sim 1/T_2$, leading to the relation between the bandwidth and the signal sensitivity:

$$\delta\omega/(\delta B)^2 \sim NT \text{(conventional method SQL)}. \quad (S3)$$

By utilizing quantum entanglement among many quantum spins, the bandwidth of the detection can be increased while maintaining the same signal sensitivity. In the protocol described throughout the present disclosure, ferromagnetic interactions among quantum spins can be used to develop quantum entanglement among X>>1 spins (where $X=\xi^d$ in d-dimensional systems). In such a scenario, the sensitivity would scale according to:

$$(\delta B')^{-1} \sim \sqrt{NT\overline{T}_2\chi}, \quad (S4)$$

where $\overline{T}_2$ is the relevant coherence time of the correlated spin state and can be generally shorter than the coherence time $T_2$ of individual spins. In particular, when each constituent spin is coupled to an independent noise bath $\overline{T}_2 \sim T_{2/\chi}$, where $\chi$ is a factor describing the enhanced sensitivity to the noise. This enhancement can offset the sensitivity gain to the signal in Eq. (S4). Nevertheless, the sensing bandwidth of the disclosed protocol is determined by the duration of each measurement cycle, $\delta\omega' \sim 1/\overline{T}_2$, leading to the relation $$\delta\omega'/(\delta B')^2 \sim \chi NT \text{(quantum correlated method)}. \quad (S5)$$

Therefore, the detection bandwidth can be improved by a factor of $\chi$ while maintaining the same sensitivity. When the disclosed protocol is used, the number of correlated spins $\chi$ is also determined from the maximum coherence time $T_2$ (or more precisely by $T_p \lesssim T_2$). Since $\chi$ itself affects $T_2$, $\chi$ can be computed self-consistently:

$$\chi = \xi^d = \left((J\overline{T}_2)^{\nu/(1+2\nu)}\right)^d = (JT_2)^{d\nu/(1+2\nu)} / \chi^{d\nu/(1+2\nu)} \quad (S6)$$

$$\Rightarrow \chi^{\frac{1+2\nu+d\nu}{1+2\nu}} = (JT_2)^{d\nu/(1+2\nu)} \quad (S7)$$

$$\Rightarrow \chi = (JT_2)^{d\nu/(1+2\nu+d\nu)}. \quad (S8)$$

For example, in the case of dipolar interactions ($J_{ij} \sim J_0/r_{ij}^3$) in a two-dimensional array of quantum spins, the phase transition can be described by the mean-field theory with the critical exponents $\nu=1$ and $z=\frac{1}{2}$, leading to $\chi \sim \xi^2 \sim (JT_2)^{4/7}$. In some embodiments, however, the noise bath often exhibits spatial correlations, which can modify the simple estimates provided in this section. Thus, as discussed in the next section, magnetic field fluctuations with microscopic origins such as dipolar spin impurities can exhibit spatial anti-correlations, which may be favorable.

Spatial Correlation of Magnetic Field Noise from a Dipole

When multiple spins are entangled, the coherence $\overline{T}_2$ time of the collective spin state may be different from the coherence time $T_2$ of constituent particles. More specifically, when each spin is coupled to an noise bath, which in this quantitative example is considered as independent, the coherence time of $\chi$ spins in the Greenberger-Horne-Zeilinger (GHZ) state, $|G\pm\rangle = (|\uparrow\rangle^{\otimes x} \pm |\downarrow\rangle^{\otimes x})/\sqrt{2}$, can be reduced to $\overline{T}_2 = T_2/\chi$, potentially offsetting the sensitivity improvement in Eq. (4) discussed above. In some applications, however, this simplified analysis is not valid since noises at different spins often exhibit correlations. Such correlations are particularly relevant in high density electronic or nuclear spin ensembles, where the decoherence of each spin (or the spin ensemble) arises dominantly from local sources such as interactions of sensing spins with nearby magnetic dipoles of different species. In such cases, the causes of decoherence may not be considered to be independent.

In this section, exemplary magnetic noise generated from a fluctuating dipole (fluctuator) is shown to exhibit spatial anti-correlations at short distances. Such anti-correlations lead to a relatively longer coherence $\overline{T}_2$ compared to $T_2/\chi$, allowing sensitivity improvements for methods utilizing entangled spin states in such exemplary applications. Such an example can begin with consideration of a single sensing spin interacting with a single fluctuator, which can create an effective magnetic field noise $\vec{B}(t)$ at the position of the spin. The coherence time of the sensing spin is determined from the spectral density function: $1/T_2 \propto S^{zz}(\omega_s)$, where $\omega_s$ is the probing frequency defined in the main text, and:

$$S^{\mu\nu}(\omega) = \int e^{i\omega t} \langle B^\mu(t) B^\nu(0) \rangle \, dt. \quad (S9)$$

Where $S^{zz}$ is a particular component of $S^{\mu\nu}$, where $\mu=\nu=z$.

Figure 5:
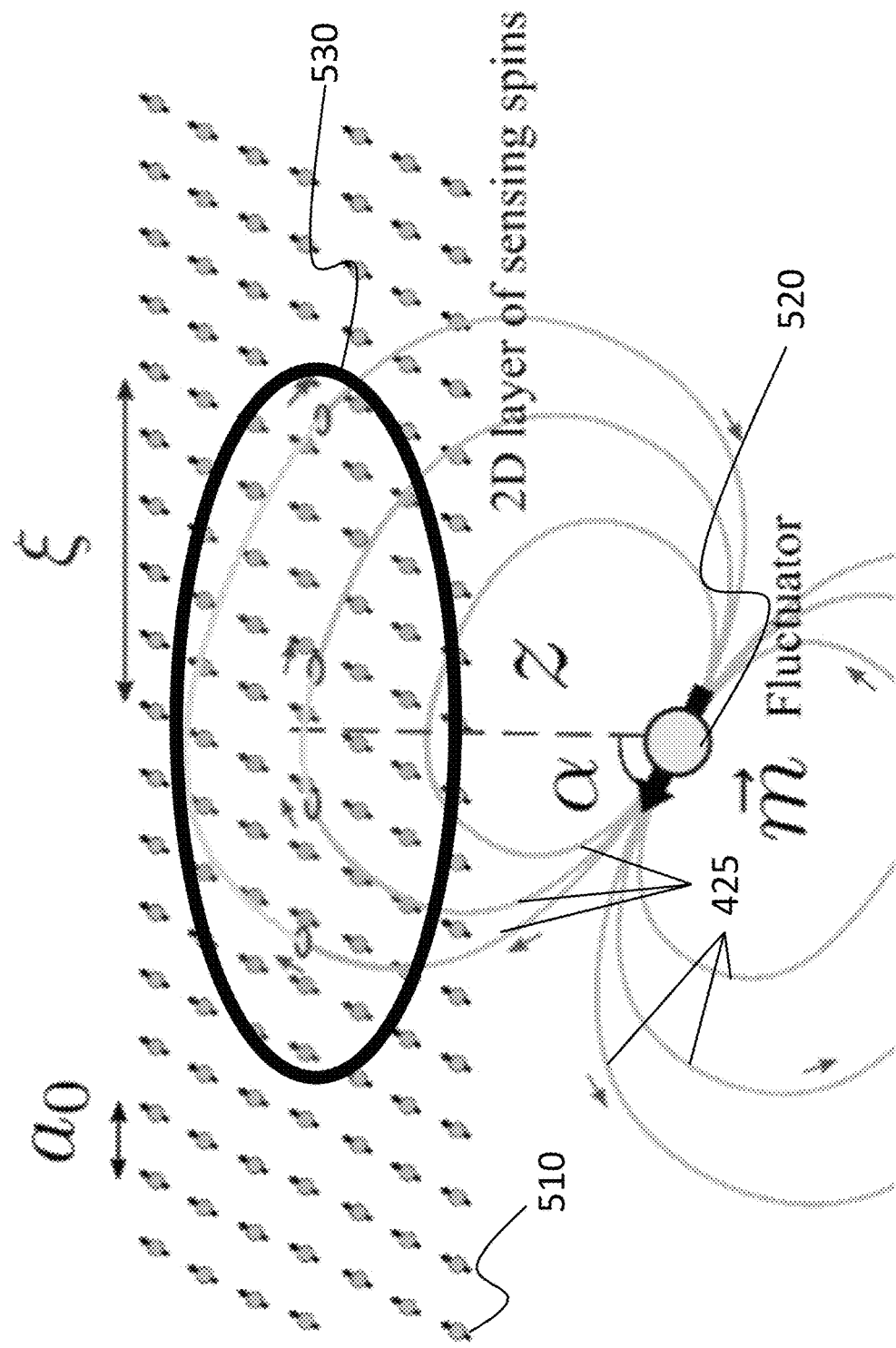
FIG. 5 shows a 2D layer of quantum spins near a fluctuator, according to some embodiments.

When multiple spins and fluctuators are located far from one another, the noise fields at distant positions originate from different fluctuators; in such case, it can be assumed that spins are coupled to their own noise bath, leading to the relation $\overline{T}_2 = T_2/\chi$ discussed above. However, when the spacing between sensing spins becomes comparable to, or even shorter than typical distances to fluctuators, the noise fields at nearby spins originate from the same fluctuator and can be correlated. For example, FIG. 5 shows a 2D layer of quantum spins 510 that are spaced at a distance $a_0$. As shown in FIG. 5, the distance $a_0$ is much smaller than the distance $z$ to fluctuator 520. For example, for an ensemble of NV centers in diamond the distance $a_0$ as small as a few nanometers can be achieved using existing technology, wherein the coherence of quantum spins is limited by dipolar interactions among spins. Thus, the field (shown by field lines 525) originates from the same source (e.g., the fluctuator 520). In such a scenario, a collection of entangled spins within the correlation length $\xi$ can experience correlated noises from the fluctuator, which can partly cancel each other, and can lead to an effectively reduced total noise for the collection.

The above-described spatial correlations play a role in determining the coherence time of GHZ states, and particularly for improving the same, since the collective spins state interacts with its environment via the effective magnetic field noise $$\vec{B}_{\mathit{eff}}(t) = \sum_i \vec{B}(\vec{r}_i, t), \tag{S10}$$

where $\vec{B}(\vec{r}_i,t)$ is the magnetic field experienced by a single spin positioned at $\vec{r}_i$. The corresponding spectral density function $S_{\mathit{eff}}^{\mu\nu}$:

$$S_{\mathit{eff}}^{\mu\nu}(\omega) = \int e^{i\omega t} \sum_{ij} \langle B^\mu(\vec{r}_i, t) B^\nu(\vec{r}_j, 0) \rangle dt, \tag{S11}$$

which sensitively depends on the spatial correlations, such as $\langle B^\mu(\vec{r}_i,t)B^\nu(\vec{r}_j,0)\rangle$ for $i \ne j$. In order to quantify the spatial correlation, a single magnetic dipole $\vec{m}$ located at a distance $z$ from a two-dimensional array of sensing spins with average spacing $\alpha_0$ can be considered (see FIG. 5). The fluctuator creates a classical magnetic field $\vec{B}(\vec{r}_i)$, and the effective field experienced by the collective spin with correlation length $\xi$ can be computed (see FIG. 5):

$$\vec{B}_{\mathit{eff}} = \sum_i \vec{B}(\vec{r}_i) \approx \frac{1}{\alpha_0^2} \int\int \vec{B}(\vec{r}) d\vec{r} \tag{S12}$$

$$= \frac{\mu_0}{4\pi\alpha_0^2} \int\int \left(\frac{3\vec{r}(\vec{m}\cdot\vec{r})}{r^5} - \frac{\vec{m}}{r^3}\right) d\vec{r} \tag{S13}$$

$$= \frac{\mu_0}{4\alpha_0^2} \frac{\xi^2}{(z^2+\xi^2)^{3/2}} (2m_z\hat{z} - m_q\hat{q}), \tag{S14}$$

where the integration is performed over the area that covers correlated spins and $m_z = m \cos\alpha$ and $m_q = m \sin\alpha$ are the projections of the dipole moment in the vertical $\hat{z}$ and planar $\hat{q}$ directions, respectively. The corresponding spectral density can scale as:

$$S_{\mathit{eff}}^{\mathit{corr}} \sim \left(\frac{\mu_0 m}{\alpha_0^2}\right)^2 \frac{\xi^4}{(z^2+\xi^2)^3}. \tag{S15}$$

According to some examples, when $z \ll \xi$, the noise density $S_{\mathit{eff}}^{\mathit{corr}}$ can be strongly suppressed. This suppression arises from the spatial profile of the magnetic field created from a dipole moment, as depicted in FIG. 5. In order to obtain the total noise density coming from multiple fluctuators at different depths, $S_{\mathit{eff}}^{\mathit{corr}}$ can be integrated over all $z \in (0, \infty)$:

$$\int_0^\infty S_{\mathit{eff}}^{\mathit{corr}} n_z dz \sim \frac{(\mu_0 m)^2}{\alpha_0^4} \frac{n_z}{\xi}, \tag{S16}$$

where the $n_z$ is the linear density of fluctuators along the perpendicular direction $\hat{z}$. Integration along $\hat{x}$ and $\hat{y}$ directions can be neglected in this embodiment due to the symmetry.

This result can be compared to a fiducial spectral density $S_{\mathit{eff}}^{\mathit{corr}}$ in the absence of spatial correlations, for example, assuming $\langle B^\mu(\vec{r}_i,t)B^\mu(\vec{r}_j,0)\rangle = 0$ for $i \ne j$. This condition is equivalent to the assumption that each spin is coupled to an independent noise source. For a single classical dipole at depth $z$, $$S_{\mathit{eff}}^{\mathit{uncorr}} \sim \sum_i |B(\vec{r}_i)|^2 \approx \frac{1}{\alpha_0^2} \int\int |\vec{B}(\vec{r})|^2 d\vec{r} \sim \frac{(\mu_0 m)^2}{\alpha_0^2}\left(\frac{1}{z^4} - \frac{1}{(z^2+\xi^2)^2}\right). \tag{S17}$$

Integrated over the entire depth $z \in (\alpha_0, \infty)$, $$\int_{\alpha_0}^\infty S_{\mathit{eff}}^{\mathit{uncorr}} n_z dz \sim \frac{(\mu_0 m)^2}{\alpha_0^2} \frac{n_z}{\xi^3} \tag{S18}$$

$$\int_{x=\alpha_0/\xi}^\infty \left(\frac{1}{x^4} - \frac{1}{(1+x^2)^2}\right) dx \sim \frac{(\mu_0 m)^2 n_z}{\alpha_0^2} \sim \frac{\xi}{\alpha_0} \int_\alpha^\infty S_{\mathit{eff}}^{\mathit{corr}} n_z dz,$$

where it was assumed that a fluctuator cannot be located closer than the spacing $\alpha_0$. Thus, for a sufficiently large correlation length, $\xi \gg \alpha_0$, the integrated noise density of the correlated case is smaller by a factor $\alpha_0/\xi$ compared to the uncorrelated case. This result implies that an effective coherence time of:

$$T_2 \sim (T_2/\chi)(\xi/\alpha_0) \sim T_2/\sqrt{\chi}. \tag{S19}$$

This sensitivity scaling implies that the reduction of the coherence time due to the enhanced susceptibility to (external) noise is less severe if noises from a fluctuator is correlated compared to when quantum spins experience independent noise.

Finally, from Eq. (S4), the sensitivity scales according to:

$$(\delta B')^{-1} \sim \sqrt{NTT_2\chi} \tag{S20}$$

$$\sim \sqrt{NTT_2}\chi^{1/4}. \tag{S21}$$

This sensitivity is better than SQL, despite the presence of local magnetic noise sources. Accordingly, even in the presence of local magnetic noise sources, the disclosed protocol can improve upon detection sensitivity. Furthermore, as discussed above, this sensitivity can be obtained across a large bandwidth.

Exemplary Calculation of Sensitivity Enhancement for Magnetic Field Imagers

According to some exemplary embodiments, the amount of sensitivity enhancement for magnetic field imagers that implement the protocols can be calculated. As discussed in more detail below, while traditional sensing techniques are limited by the effects of quantum spin spacing, the disclosed protocol allows for a higher density of quantum spins, and therefore a significantly improved signal for spatially resolved measurements.

In an example, a two-dimensional array of electronic spins such as nitrogen vacancy (NV) color centers can be used to image a spatially resolved AC magnetic field profile. Since quantum states of NV centers are optically read-out, the spatial resolution of this method is given by the diffraction limit of the optical wavelength d~$\lambda$/2≈250 nm, and can be further improved via existing sub-wavelength imaging techniques. Therefore, in order to achieve high precision AC magnetic field sensing without compromising the spatial resolution, the length scale of the probe volume can be configured so as not to exceed d (in this case, the system size). Since optical resolution is d in this example, an ensemble of spins can be considered to be within a single optical probe spot (probe volume) and as a single spin ensemble. According to some embodiments, the correlation length $\xi$ may beneficially be as large as d, but need not meet this condition. At such a length scale, however, dipolar interactions among electronic spins, $J_{dd} \sim J_0/d^3 \approx (2\pi)$ 3.3 Hz, is significant compared to the maximum coherence time of a NV center $T_2 \approx 500$ ms at low temperature (e.g., 77 K). According to traditional techniques, more than one NV center per probe volume cannot be used for the purpose of AC field sensing without affecting diffraction limited spatial resolution. Even at room temperature with the coherence time $T_2 \approx 3$ ms, the separation among NV centers should be at least $r_{min} \approx 100$ nm in order to avoid intra-spin interaction-induced decoherence. Accordingly, at most, $N_0 \approx 6$ NV centers can be used per probe volume. Accordingly, using this small increase in the number of NV centers produces a corresponding enhancement in signal-to-noise ratio $\sqrt{N_0} \approx 3$ at best in the conventional SQL.

By contrast, embodiments of the disclosed protocols dramatically alleviate the aforementioned limitations. In some embodiments, the minimum distance among NV centers are not bounded by dipolar interactions, allowing much higher particle density. In such examples, the minimum distance is restricted primarily by the length scale of electronic orbitals of NV centers, which is the order of a few nm. In an example with a single layer of NV centers, it is possible to include approximately $N_1 \approx 2,500$ or 6,400 particles to approximately 10,000 particles per probe volume. In some example implementations, such a density allows for an enhancement of a factor of approximately 50 at 77 K, and about 20 at room temperature even without accounting for the effects of quantum correlations. According to some embodiments, NV spin centers can be implemented with a density in diamond of approximately $10^{-4}$ to approximately 0.01 spins/nm$^2$ Furthermore, when the coherence time of the sensing spin is limited by correlated magnetic noises, such as that generated by proximal fluctuating dipoles, the disclosed protocol can provide additional sensitivity enhancement as discussed above. Thus, in an example of a two-dimensional array of spins, this sensitivity enhancement amounts to a factor of $x^{1/4}$ in Eq. (S21). X can be estimated self-consistently similar to Eq. (S8).

Figure 6:
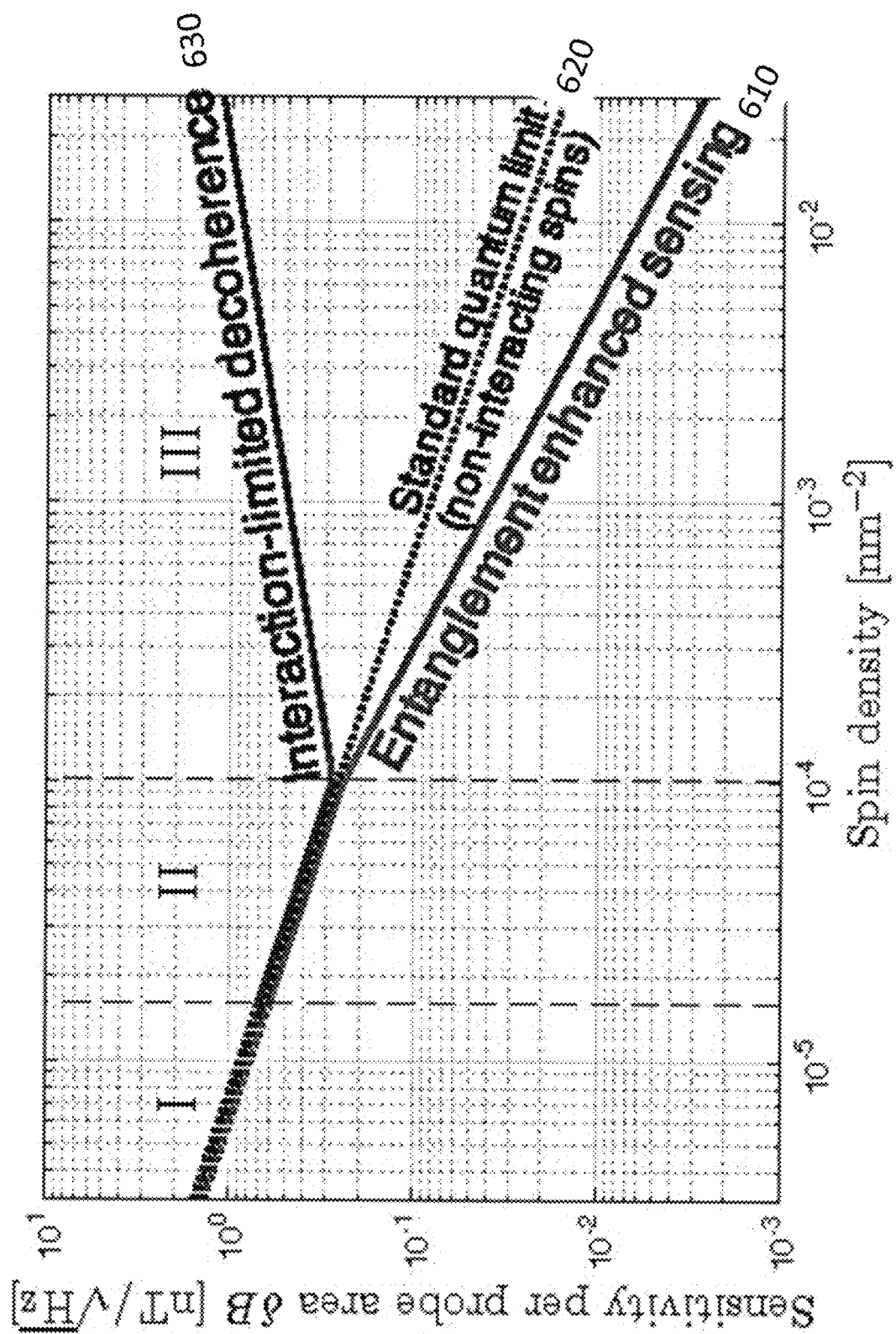
FIG. 6 shows the sensitivity scaling of a magnetic field imager as a function of spin sensor density, according to some embodiments.

FIG. 6 summarizes the sensitivity enhancement in this scenario as a function of spin density, according to some embodiments. FIG. 6 shows the sensitivity scaling of a magnetic field imager as a function of spin sensor (NV center) density. In Regime I, the magnetic field imaging is limited by spin separation. In regimes II and III, the spatial resolution is diffraction limited at optical wavelength $\lambda \approx 500$ nm. When conventional methods are used with a high-density spin ensemble in regime III, the coherence time is shortened by interactions, deteriorating the sensitivity 6B as shown in line 630. In the disclosed protocol, such limitation is circumvented. In fact, in some embodiments, the interactions are used as an advantage to further enhance the sensitivity by generating entangled many-body quantum states. Thus, sensitivity can fall below the standard quantum limit line 620 as discussed above, and can be, for example, at the entanglement enhanced sensing line 610. The example shown in FIG. 6 assumes a two-dimensional arrays of dipolar interacting spin ensembles with a single-spin coherence time $T_2 \sim 3$ ms and the diffraction-limited probe area~$(\lambda/2)^2$. In some examples, it can be assumed that the dominant source of decoherence is due to local magnetic field noise created by proximal dipolar magnetic impurities. However, such magnetic noises exhibit spatial correlations, which allow sensitivity improvement beyond standard quantum limit 620 when correlated spin states are used, as discussed above. Accordingly, beyond the disclosed protocol can show significant improvements in sensitivity by employing both correlations and higher densities of quantum spins. Although such benefits are described in the case of NV centers, similar such benefits are achieved for other types of quantum spins.

The invention claimed is:

1. A method comprising:
    initializing an ensemble of quantum spins in an entangled state;
    driving the ensemble of quantum spins in the entangled state with periodic electromagnetic pulses at a driving frequency while the ensemble of quantum spins is exposed to an external signal, wherein the driving frequency is tuned based on the frequency of the external signal to be measured;
    reading out a state of the ensemble of quantum spins, wherein the state of the ensemble of quantum spins is indicative of the strength of the external signal.

2. The method of claim 1, wherein the driving frequency is approximately twice the signal frequency.

3. The method of claim 1, wherein the electromagnetic pulses comprise $\pi$-pulses.

4. The method of claim 1, wherein the ensemble of quantum spins comprises a plurality of NV spin centers in diamond.

5. The method of claim 4, further comprising polarizing, prior to the initializing, the ensemble of quantum spins by applying an external magnetic field at a first field strength to the ensemble of quantum spins.

6. The method of claim 5, wherein the external magnetic field has a strength that is stronger than the strength of ferromagnetic interactions between the NV spin centers.

7. The method of claim 5, wherein the initializing the ensemble of quantum spins in the strongly entangled state comprises reducing the strength of the external magnetic field to a second field strength.

8. The method of claim 7, further comprising applying, during the initializing, periodic $\pi$-pulses to the ensemble of quantum spins at a frequency that is detuned from the signal frequency.

9. The method of claim 7, wherein the second field strength is zero.

10. The method of claim 7, wherein the second field strength is greater than a field strength that would cause a phase transition of the ensemble of quantum spins.

11. The method of claim 7, further comprising increasing the external magnetic field strength to a third field strength prior to the reading out the state of the ensemble of quantum spins.

12. The method of claim 11, wherein the third magnetic field strength is the same as the first magnetic field strength.

13. The method of claim 11, wherein the increasing the external magnetic field strength to the third field strength is performed at the same rate as the decreasing the magnetic field strength to the second magnetic field strength.

14. The method of claim 4, wherein the plurality of NV spin centers have a density in the diamond of approximately 10' to approximately 0.01 spins/nm$^2$.

15. The method of claim 1, wherein the strongly entangled state is one or more of a Greenberger-Horne-Zeilinger ("GHZ") state, a NOON state, a W-state, any other gaussian or non-gaussian squeezed state, or another similarly entangled state.

16. The method of claim 1, wherein the reading out the state of the ensemble of quantum spins comprises determining the average parity of the ensemble of quantum spins.

17. The method of claim 1, wherein the reading out the state of the ensemble of quantum spins comprises determining the magnetization of the ensemble of quantum spins.

18. The method of claim 1, wherein the reading out the state of the ensemble of quantum spins is performed with one or more of an avalanche photodetector (APD) or a single photon counting module (SPCM).

19. The method of claim 1, further comprising repeating the initializing, driving, and reading out for at least one second signal frequency to determine an external signal spectrum.

20. The method of claim 1, wherein the driving frequency is approximately twice the signal frequency minus an offset value of $2\Delta\omega$.

21. The method of claim 1, wherein the ensemble of quantum spins comprises a two-dimensional array of quantum spins.

22. The method of claim 1, wherein the entangled state of the ensemble of quantum spins acts as a two-state system.

23. The method of claim 1, wherein in the entangled state, one or more of Quantum Fisher information or linear susceptibility is enhanced compared to disentangled states.

* * * * *